United States Patent
Masunaga et al.

(10) Patent No.: US 8,426,108 B2
(45) Date of Patent: Apr. 23, 2013

(54) CHEMICALLY AMPLIFIED POSITIVE RESIST COMPOSITION FOR EB OR EUV LITHOGRAPHY AND PATTERNING PROCESS

(75) Inventors: Keiichi Masunaga, Joetsu (JP); Satoshi Watanabe, Joetsu (JP); Akinobu Tanaka, Joetsu (JP); Daisuke Domon, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 122 days.

(21) Appl. No.: 13/027,356

(22) Filed: Feb. 15, 2011

(65) Prior Publication Data
US 2011/0200941 A1 Aug. 18, 2011

(30) Foreign Application Priority Data
Feb. 16, 2010 (JP) ................. 2010-031030

(51) Int. Cl.
G03F 7/00 (2006.01)
G03F 7/004 (2006.01)
G03F 7/20 (2006.01)

(52) U.S. Cl.
USPC ............ 430/270.1; 430/5; 430/905; 430/913; 430/942

(58) Field of Classification Search ............... 430/270.1, 430/5, 280.1, 942, 905, 913
See application file for complete search history.

(56) References Cited

U.S. PATENT DOCUMENTS

| | | | |
|---|---|---|---|
| 5,780,206 A | 7/1998 | Urano et al. | |
| 5,939,242 A | 8/1999 | Tang et al. | |
| 6,242,153 B1 | 6/2001 | Sato et al. | |
| 7,244,542 B2 * | 7/2007 | Bae et al. | 430/270.1 |
| 7,252,924 B2 * | 8/2007 | Yamanaka et al. | 430/270.1 |
| 7,449,277 B2 | 11/2008 | Hatakeyama et al. | |
| 7,501,223 B2 | 3/2009 | Takeda et al. | |
| 7,960,091 B2 * | 6/2011 | Shimizu et al. | 430/270.1 |
| 8,057,982 B2 * | 11/2011 | Hatakeyama et al. | 430/270.1 |
| 8,092,978 B2 * | 1/2012 | Yamashita | 430/270.1 |
| 8,105,748 B2 * | 1/2012 | Ohashi et al. | 430/270.1 |
| 8,114,571 B2 * | 2/2012 | Ohashi et al. | 430/270.1 |
| 8,168,369 B2 * | 5/2012 | Cho et al. | 430/270.1 |
| 8,187,789 B2 * | 5/2012 | Yonemura et al. | 430/270.1 |
| 2004/0260031 A1 | 12/2004 | Takeda et al. | |
| 2006/0134547 A1 * | 6/2006 | Huang et al. | 430/270.1 |
| 2008/0020290 A1 * | 1/2008 | Hatakeyama et al. | 430/4 |
| 2008/0096128 A1 | 4/2008 | Takeda et al. | |
| 2009/0087789 A1 | 4/2009 | Hirano et al. | |
| 2009/0124726 A1 * | 5/2009 | Goh et al. | 523/204 |
| 2009/0197197 A1 * | 8/2009 | Shimizu et al. | 430/270.1 |
| 2009/0202942 A1 * | 8/2009 | Fukui et al. | 430/283.1 |
| 2009/0269696 A1 | 10/2009 | Ohsawa et al. | |
| 2009/0269701 A1 * | 10/2009 | Irie et al. | 430/285.1 |
| 2009/0317739 A1 | 12/2009 | Thiyagarajan et al. | |
| 2010/0167200 A1 * | 7/2010 | Choi et al. | 430/270.1 |
| 2010/0304301 A1 * | 12/2010 | Tanaka et al. | 430/285.1 |
| 2011/0003247 A1 * | 1/2011 | Ohashi et al. | 430/270.1 |
| 2011/0033799 A1 * | 2/2011 | Watanabe et al. | 430/270.1 |
| 2011/0039204 A1 * | 2/2011 | Ohashi et al. | 430/270.1 |
| 2011/0129765 A1 * | 6/2011 | Tanaka et al. | 430/5 |
| 2011/0143266 A1 * | 6/2011 | Tanaka et al. | 430/5 |

FOREIGN PATENT DOCUMENTS

| | | | |
|---|---|---|---|
| EP | 1 698 937 | A2 | 9/2006 |
| EP | 1 775 632 | A1 | 4/2007 |
| EP | 2 042 925 | A2 | 4/2009 |
| EP | 2 042 925 | A3 | 6/2009 |
| EP | 2 112 554 | A2 | 10/2009 |
| EP | 2 112 554 | A3 | 12/2010 |
| JP | 7-319155 | A | 12/1995 |
| JP | 2004-115630 | A | 4/2004 |
| JP | 2005-8766 | A | 1/2005 |
| JP | 2007-114728 | A | 5/2007 |
| JP | 2008-95009 | A | 4/2008 |
| JP | 2008-102383 | A | 5/2008 |
| JP | 2008-133312 | A | 6/2008 |
| JP | 2008197606 | A * | 8/2008 |
| JP | 2009-86310 | A | 4/2009 |
| JP | 2009-263487 | A | 11/2009 |

OTHER PUBLICATIONS

Machine translation of JP 2008-197606 (no date).*
Extended European Search Report, dated Jul. 8, 2011, for European Application No. 11001082.4.

* cited by examiner

*Primary Examiner* — Amanda C. Walke
(74) *Attorney, Agent, or Firm* — Birch, Stewart, Kolasch & Birch, LLP

(57) ABSTRACT

A chemically amplified positive resist composition for EB or EUV lithography is provided comprising (A) a polymer or a blend of polymers wherein a film of the polymer or polymer blend is insoluble in alkaline developer, but turns soluble under the action of acid, (B) an acid generator, (C) a basic compound, and (D) a solvent. The basic compound (C) is a polymer comprising recurring units bearing a side chain having a secondary or tertiary amine structure as a basic active site and constitutes a part or the entirety of the polymer or polymers as component (A).

5 Claims, No Drawings

CHEMICALLY AMPLIFIED POSITIVE RESIST COMPOSITION FOR EB OR EUV LITHOGRAPHY AND PATTERNING PROCESS

CROSS-REFERENCE TO RELATED APPLICATION

This non-provisional application claims priority under 35 U.S.C. §119(a) on Patent Application No. 2010-031030 filed in Japan on Feb. 16, 2010, the entire contents of which are hereby incorporated by reference.

TECHNICAL FIELD

This invention relates to a chemically amplified positive resist composition which is sensitive to electron beam (EB) or extreme ultraviolet (EUV) radiation and suited for use in the fabrication of semiconductor devices and photomasks, and more particularly, to a chemically amplified positive resist composition which is effective in the exposure step of EB or EUV lithography, and a patterning process using the same.

BACKGROUND ART

In the recent drive for higher integration of ICs, it is desired to form a finer size pattern. When resist patterns with a feature size of 0.2 μm or less are formed by lithography, chemically amplified resist compositions utilizing the catalysis of acid are often used in order to attain a high sensitivity and resolution. Since materials used in chemically amplified resist compositions must have a certain level of transmittance to energy radiation for use in pattern exposure, a suitable one is selected from numerous materials in accordance with the wavelength of energy radiation.

As is well known in the art, chemically amplified positive resist compositions which are commercially implemented at the present are developed by modifying the traditional two-component resist system. These compositions are generally composed of two main functional components: a polymer having acidic functional groups to render the polymer soluble in alkaline developer wherein some or all acidic functional groups are protected with acid labile protective groups so that the polymer is insoluble in alkaline developer, and an acid generator capable of generating an acid upon exposure to high-energy radiation. However, the activity of the acid generated by the acid generator must be controlled in order to attain a high resolution. To this end, a basic compound must be added as an additional component.

Base resins comprising an aromatic skeleton are kept away in the ArF and $F_2$ lithography since they exhibit substantial absorption to ArF excimer laser and $F_2$ laser radiation. These resins are used as a main component in KrF excimer laser and EB lithography, since the aromatic skeleton has high etch resistance and a phenolic hydroxyl group serves as the adhesive group to the substrate to provide good physical properties. For the EUV on which development works are concentrated as the next generation light source, there is a strong possibility of using a resin comprising an aromatic skeleton as the matrix material.

Of the polymers comprising an aromatic skeleton, a polymer comprising recurring units of 4-hydroxystyrene is most commonly used so far. This polymer has a phenolic hydroxyl group of weak acidity within the recurring unit while this functional group exhibits good adhesion to the substrate as well as solubility in alkaline developer. If the polymer is combined with protection of the phenolic hydroxyl group with an acid labile protective group, or with (meth)acrylic recurring units protected with an acid labile protective group, then a switch of solubility in alkaline developer can be triggered by an acid catalyst. Based on this concept, a number of polymers have been proposed. In JP-A 2008-95009, for example, a rectangular pattern having a line width of 70 nm is formed.

On the other hand, recurring units of (meth)acrylic acid exhibit insignificant absorption near wavelength 200 nm if the substituent group is alicyclic, and various copolymers can be readily prepared through copolymerization. Many polymers comprising recurring units of (meth)acrylic acid are used as the resist adapted for exposure to ArF excimer laser light. Those (meth)acrylic acid recurring units whose ester substituent group has an aromatic skeleton, despite more absorption near wavelength 200 nm, exhibit not only high etch resistance, but also have a tendency of displaying a reduced line edge roughness upon pattern formation. Their application to the EB or EUV lithography is proposed in JP-A 2007-114728.

In the course of development of the foregoing resist compositions, many modifications are made on various materials to improve the resist performance. Many modifications of the basic compound for inhibiting acid diffusion have been reported. For example, in conjunction with the resist composition for use in the ArF immersion lithography involving exposure of a resist film to ArF excimer laser light in a setup that a water layer is formed on the resist film, JP-A 2008-133312 proposes to use a polymer having a basic compound bound thereto in order to prevent the basic compound from migrating and diffusing into the water phase in contact with the resist film to alter the resolution of the resist surface region.

As an exemplary polymer endowed with a nitrogen-containing partial structure, a resist composition using a heterocycle-bearing polymer is disclosed in JP-A 2009-86310 although this is not for the purpose of restraining acid diffusion.

Citation List

Patent Document 1: JP-A 2008-95009 (U.S. Pat. No. 7,501,223)
Patent Document 2: JP-A 2007-114728 (U.S. Pat. No. 7,449,277)
Patent Document 3: JP-A 2008-133312
Patent Document 4: JP-A 2009-86310 (US 2009087789, EP 2042925)
Patent Document 5: JP-A H07-319155
Patent Document 6: JP-A 2009-263487 (US 2009269696, EP 2112554)
Patent Document 7: JP-A 2008-102383 (US 2008096128)
Patent Document 8: JP-A 2004-115630
Patent Document 9: JP-A 2005-008766 (US 2004260031)

DISCLOSURE OF INVENTION

While the EB lithography is utilized in ultrafine size patterning, it is also essential in processing a photomask blank into a photomask for use in the microfabrication of semiconductor devices. Pattern writing with electron ray in the processing of photomask blanks is generally performed using an electron beam (EB) without a need for mask. In writing of positive tone resist, a portion of a resist film other than the region to be left is successively irradiated with an EB that defines a ultrafine area spot. The operation of scanning across the entire finely divided regions of the work surface takes a long time as compared with the block exposure using a photomask. The resist film is needed to have a high sensitivity in order to perform the writing step without detracting from the throughput. Since the writing time is long, there is a propensity to introduce a difference between an early written portion and a later written portion. The stability in vacuum of exposed portion with the lapse of time is the critical performance requirement. Furthermore, if baking (PEB) following pattern writing entails a substantial variation of line width which largely depends on the baking temperature, such a variation is detrimental to mask processing for forming a fine size pattern. It would be desirable to have a chemically amplified positive resist composition featuring less temperature dependence.

Meanwhile, for the control of resist sensitivity and pattern profile as described above, a variety of improvements have been made in the selection and combination of materials used in the resist compositions and processing conditions. One of such improvements pertains to the diffusion of base that has a significant impact on the resolution of a chemically amplified resist film. While it is required in photomask processing that the resulting resist pattern do not change its profile depending on the duration between exposure and post-exposure bake as discussed above, the most cause of time-dependent profile change is the diffusion of base generated upon exposure. Apart from the photomask processing, this base diffusion problem may have a significant impact on the sensitivity and resolution of general resist films.

An object of the invention is to provide a chemically amplified positive resist composition adapted to be processed by EB or EUV lithography to form a pattern featuring a high resolution, reduced LER, and a minimized variation of line width with changing temperature, and a patterning process using the same.

The invention pertains to a chemically amplified positive resist composition adapted for use in the EB or EUV lithography rather than the immersion lithography wherein the surface of resist film contacts with water or fluid as described in Patent Document 3. The inventors have found that when a polymer comprising recurring units of the general formulae (1) and (2) shown below is used in the resist composition, it contributes to reductions of LER and temperature dependence as well as an improvement in resolution.

In one aspect, the invention provides a chemically amplified positive resist composition for EB or EUV lithography, comprising (A) a polymer or a blend of polymers, at least one polymer having a protective group which is deprotected with an acid so that a film of the polymer or polymer blend is insoluble in alkaline developer, but turns soluble therein under the action of acid, (B) an acid generator capable of generating an acid, (C) a basic compound for inhibiting the action of acid, and (D) a solvent. The basic compound as component (C) is a polymer comprising recurring units bearing a side chain having a secondary or tertiary amine structure as a basic active site and constitutes at least one polymer as component (A). The composition may optionally further comprise a compound having a molecular weight of up to 1,000 as component (C) other than the basic compound in polymer form, in an amount of up to $\frac{1}{20}$ mole per mole of the acid generator as component (B).

In a preferred embodiment, the recurring units bearing a side chain having a secondary or tertiary amine structure are recurring units having an atomic linkage of at least two consecutive atoms, which is not taken in ring structure, between the carbon of the main chain to which the side chain is bonded and the nitrogen atom in the amine structure.

More preferably, the basic compound as component (C) is a polymer comprising recurring units of the general formulae (1) and (2):

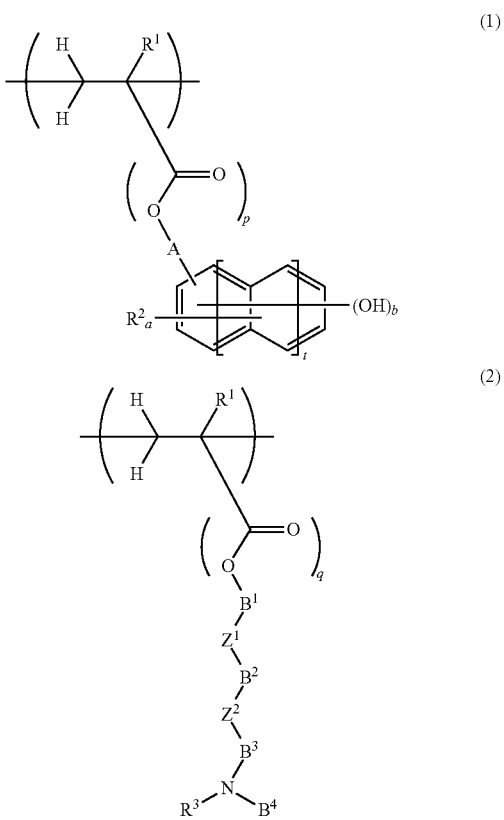

wherein A is a single bond or a $C_1$-$C_{10}$ alkylene group which may be separated by an ethereal oxygen atom; $R^1$ is each independently hydrogen or methyl; $R^2$ is each independently a $C_1$-$C_6$ alkyl group; $B^1$, $B^2$, and $B^3$ are each independently a single bond, or a linkage selected from the group consisting of a straight or branched $C_1$-$C_{10}$ alkylene group which may contain an ethereal oxygen atom, a divalent $C_5$-$C_{10}$ alicyclic group which may be separated by an ethereal oxygen atom, a divalent $C_6$-$C_{14}$ aromatic group which may be separated by an ethereal oxygen atom, and combinations comprising at least one of the foregoing; $Z^1$ and $Z^2$ are each independently a single bond, —CO—O— or —O—CO—, with the proviso that $Z^1$ and $Z^2$ do not form a —O—O— structure when $B^1$, $B^2$, and $B^3$ contain an ethereal oxygen atom, and $B^3$ is not a single bond when $Z^2$ is —CO—O— or —O—CO—; $R^3$ and $R^4$ are each independently hydrogen or a monovalent $C_1$-$C_{10}$ hydrocarbon group which may contain a heteroatom, with the proviso that $R^3$ and $R^4$ are not hydrogen at the same time, $R^3$ and $R^4$ may bond together to form a ring with the nitrogen atom to which they are attached, and $R^3$ and $R^4$ are a divalent $C_2$-$C_{12}$ hydrocarbon group which may contain a heteroatom when they form a ring; $B^3$ may bond with $R^3$ or $R^4$ to form a ring with the nitrogen atom to which they are attached, and in this case, the nitrogen-containing ring is a 5 to 7-membered ring which excludes a ring of the structure that a lone pair of the nitrogen atom renders the nitrogen-containing ring aromatic, and the nitrogen-containing ring is not an aromatic ring; a is an integer of 0 to 4, b is a positive integer of 1 to 5, p and q are each independently 0 or 1, t is an integer of 0 to 2, with the proviso that when q=0, the atom in $B^1$ that bonds with a main chain carbon is an ethereal oxygen atom or a carbon atom forming an aromatic ring, and when q=0 and $Z^1$ and $Z^2$ are single bonds, one or more of $B^1$, $B^2$, and $B^3$ should contain at least two consecutive carbon atoms originating from an alkylene group, or an aromatic group.

In a more preferred embodiment, the basic compound as component (C) is a polymer comprising recurring units of the general formula (3) in addition to the recurring units of formulae (1) and (2),

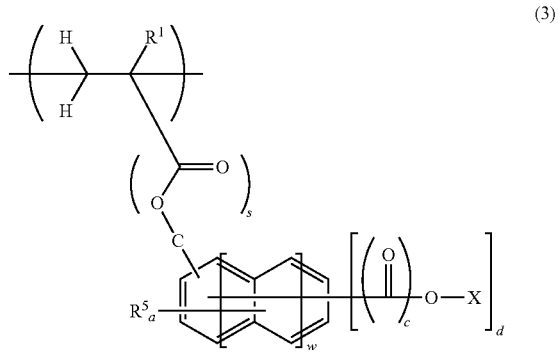

wherein C is a single bond or a $C_1$-$C_{10}$ alkylene group which may contain an ethereal oxygen atom, $R^1$ is hydrogen or methyl, $R^5$ is each independently a $C_1$-$C_6$ alkyl group, X is an acid labile group when d is 1, and X is hydrogen or an acid labile group when d is 2 or 3, with at least one X being an acid labile group, a is an integer of 0 to 4, c is 0 or 1, d is an integer of 1 to 3, s is 0 or 1, and w is an integer of 0 to 2.

In another aspect, the invention provides a pattern forming process comprising the steps of applying the positive resist composition defined above onto a processable substrate to form a resist film, exposing the film patternwise to EB or EUV radiation, and developing the exposed film with an alkaline developer to form a resist pattern.

In a preferred embodiment, the processable substrate is a photomask blank. Typically, the photomask blank comprises a chromium compound at the outermost surface.

ADVANTAGEOUS EFFECT OF INVENTION

When a chemically amplified positive resist composition comprising a basic polymer defined herein as component (C) is used in a EB or EUV lithography process of forming a resist pattern which is required to have a ultrafine size, the distribution of the base in the resist film is more uniform. The resist composition is expected to exhibit a high resolution and improved LER and be less temperature dependent.

DESCRIPTION OF EMBODIMENTS

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The terminology "($C_x$-$C_y$)", as applied to a particular unit, such as, for example, a chemical compound or a chemical substituent group, means having a carbon atom content of from "x" carbon atoms to "y" carbon atoms per such unit.

The acronym LER stands for line edge roughness, PEB for post-exposure bake, and PAG for photoacid generator.

A chemically amplified positive resist composition for EB or EUV lithography is defined herein as comprising (A) a polymer or a blend of polymers wherein at least one polymer (one polymer, some polymers or all polymers) has a protective group which is deprotected with an acid so that a film of the polymer or polymer blend is normally insoluble in alkaline developer, but the film turns soluble in alkaline developer under the action of acid, (B) an acid generator capable of generating an acid, (C) a basic compound for inhibiting the action of acid, and (D) a solvent as essential components. The basic compound as component (C) is a polymer comprising recurring units bearing a side chain having a secondary amine structure (secondary amino group having two different carbons bonded thereto) or a tertiary amine structure (tertiary amino group having three different carbons bonded thereto) as a basic active site and at the same time, constitutes at least one polymer serving as component (A). The composition may optionally further comprise a basic compound having a molecular weight of up to 1,000 as component (C) other than the basic compound in polymer form. If used, the basic compound having a molecular weight of up to 1,000 is present in an amount of up to ½₀ mole per mole of the acid generator as component (B). It is noted that the term "amino group" used herein excludes amide group.

When a chemically amplified positive resist composition is used to form a pattern by photolithography, a basic compound as component (C) is typically added as an essential component having a function of providing a high resolution by controlling the reactivity of an acid generated by the acid generator in the resist film upon exposure to high-energy radiation. The addition of a basic component in polymer form has not been practiced although Patent Document 5 indicates a possibility of using polyvinyl pyridine. Patent Document 4 discloses a resist composition comprising a polymer comprising recurring units having a heteroatom-containing cyclic structure. Specifically a polymer having a nitrogen-containing cyclic structure is described. In this resist composition comprising the above polymer, a basic compound of low molecular weight is separately added for controlling the activity of acid. In fact, a comparison in sensitivity between a polymer having oxygen as the heteroatom and a polymer having nitrogen as the heteroatom reveals that the nitrogen atom does not effectively function as an acid activity inhibitor.

In contrast, the inventors have found that when a polymer comprising recurring units bearing a side chain having a secondary or tertiary amine structure as a basic active site is used as a basic compound that functions as an acid activity inhibitor, a chemically amplified positive resist composition can be formulated therefrom which is expected to exhibit a high resolution and improved LER and be less temperature dependent.

The basic compound as component (C) should have a basicity at least enough to provide an effective acid activity control ability whereas such an effect is not available from an active site exhibiting a low basicity like amidic and pyridic nitrogen atoms.

Typically the recurring units bearing a side chain having a secondary or tertiary amine structure are recurring units having an atomic linkage of at least two consecutive atoms, which is not taken in ring structure, between the carbon of the main chain to which the side chain is bonded and the nitrogen atom of the amine structure. This is because the amino group's nitrogen in the polymer has a reduced acid capture ability due to spatial limitation, as compared with a low molecular weight compound. It is thus preferred that the side chain have a degree of freedom above a certain level in order to insure the function of a basic compound. The atomic linkage of at least two consecutive atoms, which is not taken in ring structure, may be, for example, an ester structure, or an optionally substituted dimethylene chain or ethylene oxide chain, a combination thereof, or even a longer methylene chain or ethylene oxide chain, as will be described later.

Typically the basic compound which is used as component (C) in the resist composition is a polymer or high molecular weight compound comprising recurring units of the general formulae (1) and (2).

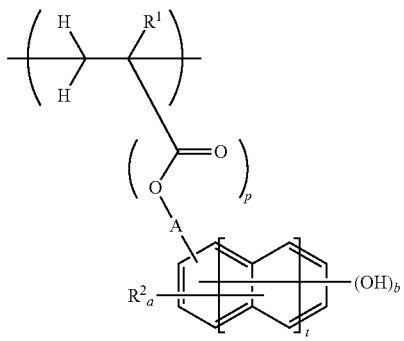

(1)

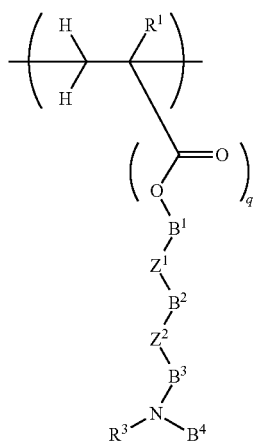

(2)

Herein A is a single bond or a $C_1$-$C_{10}$ alkylene group which may be separated by an ethereal oxygen atom. $R^1$ is each independently hydrogen or methyl. $R^2$ is each independently a $C_1$-$C_6$ alkyl group. $B^1$, $B^2$, and $B^3$ are each independently a single bond, or a linkage selected from among a straight or branched $C_1$-$C_{10}$ alkylene group which may contain an ethereal oxygen atom, a divalent $C_5$-$C_{10}$ alicyclic group which may be separated by an ethereal oxygen atom, a divalent $C_6$-$C_{14}$ aromatic group which may be separated by an ethereal oxygen atom, and combinations comprising at least one of the foregoing. $Z^1$ and $Z^2$ are each independently a single bond, —CO—O— or —O—CO—, with the proviso that $Z^1$ and $Z^2$ do not form a —O—O— structure when $B^1$, $B^2$, and $B^3$ contain an ethereal oxygen atom, and $B^3$ is not a single bond when $Z^2$ is —CO—O— or —O—CO—. $R^3$ and $R^4$ are each independently hydrogen or a monovalent $C_1$-$C_{10}$ hydrocarbon group which may contain a heteroatom, with the proviso that $R^3$ and $R^4$ are not hydrogen at the same time. $R^3$ and $R^4$ may bond together to form a ring with the nitrogen atom to which they are attached, and $R^3$ and $R^4$ are a divalent $C_2$-$C_{12}$ hydrocarbon group which may contain a heteroatom when they form a ring. $B^3$ may bond with $R^3$ or $R^4$ to form a ring with the nitrogen atom to which they are attached, and in this case, the nitrogen-containing ring is a 5 to 7-membered ring which excludes a ring of the structure that a lone pair of the nitrogen atom renders the nitrogen-containing ring aromatic, and the nitrogen-containing ring is not an aromatic ring. The subscript "a" is an integer of 0 to 4, "b" is a positive integer of 1 to 5, p and q are each independently 0 or 1, t is an integer of 0 to 2, with the proviso that when q=0, the atom in $B^1$ that bonds with a main chain carbon is an ethereal oxygen atom or a carbon atom forming an aromatic ring, and when q=0 and $Z^1$ and $Z^2$ are single bonds, one or more of $B^1$, $B^2$, and $B^3$ should contain at least two consecutive carbon atoms originating from an alkylene group, or an aromatic group. Understandably, the phrase that an alkylene group may be separated by an ethereal oxygen atom, for example, means that an ethereal oxygen atom may intervene at any intermediate position of the alkylene chain.

The recurring units of formula (1) contribute to etch resistance and adhesion to a substrate. These recurring units are already found in many resist compositions for the KrF excimer laser lithography and EB lithography including the patent documents cited above.

In formula (1), A is a single bond or a $C_1$-$C_{10}$ alkylene group which may be separated by an ethereal oxygen atom (or ether bond). Preferred examples of the alkylene group include methylene, ethylene, propylene, butylene, pentylene, hexylene, and structural isomers of a carbon skeleton having branched or cyclic structure. For the alkylene group containing an ethereal oxygen atom, where p in formula (1) is 1, the ethereal oxygen atom may be incorporated at any position excluding the position between the α- and β-carbons relative to the ester oxygen. Where p is 0, the atom in A that bonds with the main chain becomes an ethereal oxygen atom, and a second ethereal oxygen atom may be incorporated at any position excluding the position between the α- and β-carbons relative to that ethereal oxygen atom. Alkylene groups having more than 10 carbon atoms are undesirable because of a low solubility in alkaline developer.

$R^2$ is each independently a $C_1$-$C_6$ alkyl group. Preferred examples of the alkyl group include methyl, ethyl, propyl, isopropyl, butyl, pentyl, hexyl, and structural isomers of a carbon skeleton having branched or cyclic structure. Alkyl groups having more than 6 carbon atoms are undesirable because of a low solubility in alkaline developer.

The subscript "a" is an integer of 0 to 4, and "b" is a positive integer of 1 to 5. Preferably, a is an integer of 0 to 3 and b is an integer of 1 to 3 when t is 0. Also preferably, a is an integer of 0 to 4 and b is an integer of 1 to 5 when t is 1 or 2. The subscript t is an integer of 0 to 2. The structure represents a benzene skeleton when t=0, a naphthalene skeleton when t=1, and an anthracene skeleton when t=2.

Of the recurring units of formula (1), those recurring units wherein p is 0 and A is a single bond (meaning that the aromatic ring is directly bonded to the main chain of the polymer), that is, linker-free recurring units are units derived from monomers in which an α-substituted or unsubstituted vinyl group is attached to a hydroxyl-substituted aromatic ring, as typified by hydroxystyrene units. Preferred examples include 3-hydroxystyrene, 4-hydroxystyrene, 5-hydroxy-2-vinylnaphthalene, and 6-hydroxy-2-vinylnaphthalene.

Those recurring units wherein p is 1, that is, recurring units having an ester structure as the linker are units of carbonyl-substituted vinyl monomers as typified by (meth)acrylates.

Preferred examples of the units of formula (1) having a linker (—CO—O-A-) derived from (meth)acrylates are shown below.

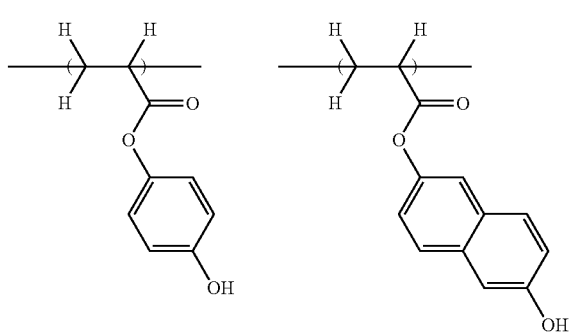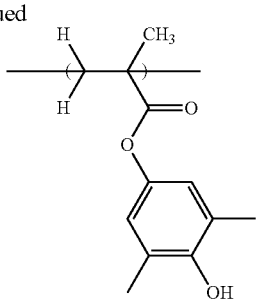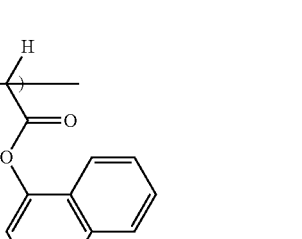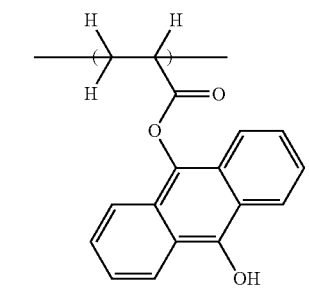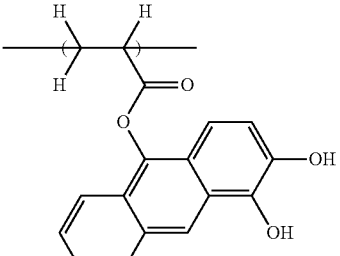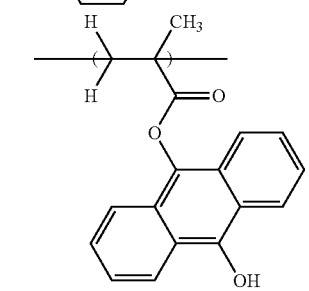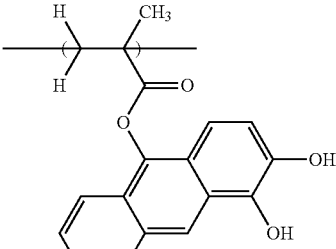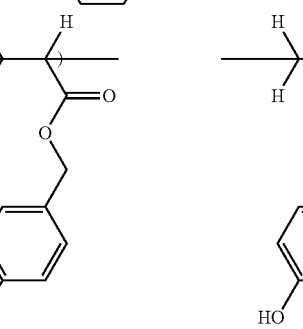

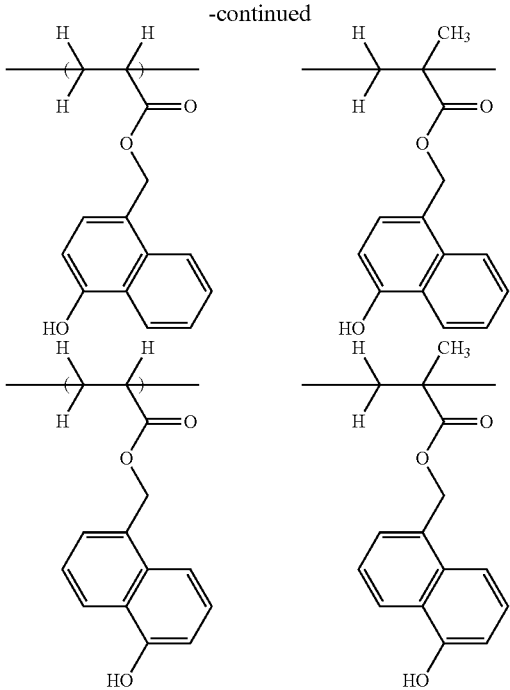

The recurring units of formula (2) are recurring units having a side chain containing a secondary amino group having two different carbons bonded thereto or a tertiary amino group having three different carbons bonded thereto as the basic active site. Now that $B^3$ is not a single bond when $Z^2$ is —O—CO—, the nitrogen atom represented by N in formula (2) does not become amidic nitrogen, and it has a strong proton-capture ability unlike nitrogen contained in pyridine or pyrrole ring. Whether or not the side chain of the recurring unit of formula (2) has an ester structure, the group represented by $B^1$, $B^2$ or $B^3$ in formula (2) contains as a partial structure a linkage having at least two single bonds (capable of free rotation) originating from an alkylene group of at least 2 carbon atoms or aromatic group, and therefore, the nitrogen atom has a sufficient thermal motion ability to capture a proton. Particularly when the side chain has an ester structure, or when the group represented by $B^1$, $B^2$ or $B^3$ in formula (2) contains as a partial structure at least 2 consecutive carbon atoms originating from an alkylene group, the nitrogen atom represented by N in formula (2) has a high thermal motion ability and hence, an advantageous acid capture ability. That is, the nitrogen atom represented by N in formula (2) has a sufficient thermal motion ability and an advantageous acid capture ability.

It is noted that Patent Document 4 describes a polymer possessing a heterocycle having a nitrogen atom originating from a pyrrole or pyridine ring or a nitrogen atom with a low degree of freedom at a relative position to the main chain. A basic compound is separately added to the resist composition according to Patent Document 4. The data in Examples do not demonstrate the tendency that a nitrogen-containing polymer has a lower sensitivity than a nitrogen-free polymer. It is understood that the nitrogen in the polymer described in Patent Document 4 has a low proton capture ability and serves a different function from the recurring units of formula (2) according to the invention.

In formula (2), $B^1$, $B^2$, and $B^3$ are each independently a single bond, or a linkage selected from among a $C_1$-$C_{10}$ alkylene group which may contain an ethereal oxygen atom, a divalent $C_5$-$C_{10}$ alicyclic group which may be separated by an ethereal oxygen atom, a divalent $C_6$-$C_{14}$ aromatic group which may be separated by an ethereal oxygen atom, and combinations comprising one or more of the foregoing. $Z^1$ and $Z^2$ are each independently a single bond, —CO—O— or —O—CO—, with the proviso that $Z^1$ and $Z^2$ do not form a —O—O— structure when $B^1$, $B^2$, and $B^3$ contain an ethereal oxygen atom, and $B^3$ is not a single bond when $Z^2$ is —CO—O— or —O—CO—.

Preferred examples of the alkylene group represented by $B^1$, $B^2$ and $B^3$ include methylene, ethylene, propylene, butylene, pentylene, hexylene, and structural isomers thereof having branched structure. The alkylene group may contain an ethereal oxygen atom at an intermediate, and preferred examples thereof include, when expressed from the ester oxygen side, ethyleneoxymethylene, ethyleneoxyethylene, ethyleneoxy-1,2-propylene, ethyleneoxy-1,3-propylene, 1,2-propyleneoxymethylene, 1,2-propyleneoxyethylene, 1,2-propyleneoxy-1,2-propylene, 1,2-propyleneoxy-1,3-propylene, 1,3-propyleneoxymethylene, 1,3-propyleneoxyethylene, 1,3-propyleneoxy-1,2-propylene, and 1,3-propyleneoxy-1,3-propylene. Preferred examples of the alicyclic group include 1,3-cyclopentylene, 1,4-cyclohexylene, 2,3-norbornylene, 2,5-norbornylene, 2,6-norbornylene, and 1,3-adamantylene. Preferred examples of the aromatic group include 1,3-phenylene, 1,4-phenylene, 1,4-naphthylene, 1,5-naphthylene, and 2,6-naphthylene.

$B^1$, $B^2$ and $B^3$ may be selected from the foregoing groups, alone or in combination of two or more such that the number of carbon atoms does not exceed 14, preferably 10. A carbon count in excess of 14 is undesirable because of a low solubility in alkaline developer.

In formula (2), q is 0 or 1. In case of q=0, the atom in $B^1$ that bonds with a main chain carbon is an ethereal oxygen atom or a carbon atom forming an aromatic ring. Then, upon polymerization, a monomer from which recurring units (2) are derived is readily copolymerizable with a monomer from which other recurring units are derived. In case of q=1, the units of formula (2) are recurring units derived from s (meth)acrylate. Where q=0 and $Z^1$ and $Z^2$ are single bonds, one or more of $B^1$, $B^2$, and $B^3$ should contain at least two consecutive carbon atoms originating from an alkylene group, or an aromatic group.

$R^3$ and $R^4$ are each independently hydrogen or a monovalent $C_1$-$C_{10}$ hydrocarbon group which may contain a heteroatom, with the proviso that $R^3$ and $R^4$ are not hydrogen at the same time. Alternatively, $R^3$ and $R^4$ may bond together to form a ring with the nitrogen atom to which they are attached, and $R^3$ and $R^4$ are a divalent $C_2$-$C_{12}$ hydrocarbon group which may contain a heteroatom when they form a ring. Suitable hydrocarbon groups include methyl, ethyl, propyl, isopropyl, butyl and isobutyl. Suitable hydrocarbon groups containing an ether bond include 2-methoxyethyl, 2-ethoxyethyl, 2-propoxyethyl, 2-isopropoxyethyl, 2-methoxypropyl, 2-ethoxypropyl, 2-propoxypropyl, 2-isopropoxypropyl, 3-methoxypropyl, 3-ethoxypropyl, and 3-propoxypropyl. When $R^3$ and $R^4$ taken together form a ring, a 5 or 6-membered ring is preferred. Suitable heteroatoms include oxygen, nitrogen and sulfur, with oxygen being preferred.

$B^3$ may bond with $R^3$ or $R^4$ to form a ring with the nitrogen atom to which they are attached. In this case, the nitrogen-containing ring is a 5 to 7-membered ring, preferably 5 or 6-membered ring. Where $B^3$ bonds with $R^3$ or $R^4$ to form a ring with the nitrogen atom to which they are attached, the nitrogen-containing ring is not a ring of the structure that a lone pair of the nitrogen atom represented by N in formula (2) renders the nitrogen-containing ring aromatic, and the nitrogen-containing ring is not an aromatic ring. Exemplary rings of the structure to be excluded herein are pyrrole and pyridine rings.

Preferred examples of the recurring units derived from (meth)acrylates, that is, recurring units of formula (2) wherein q is 1, $B^1$ and $B^2$ are single bonds, $Z^1$ and $Z^2$ are single bonds, and $B^3$ is alkylene are given below. Note that $R^1$ is as defined above, and Me stands for methyl.

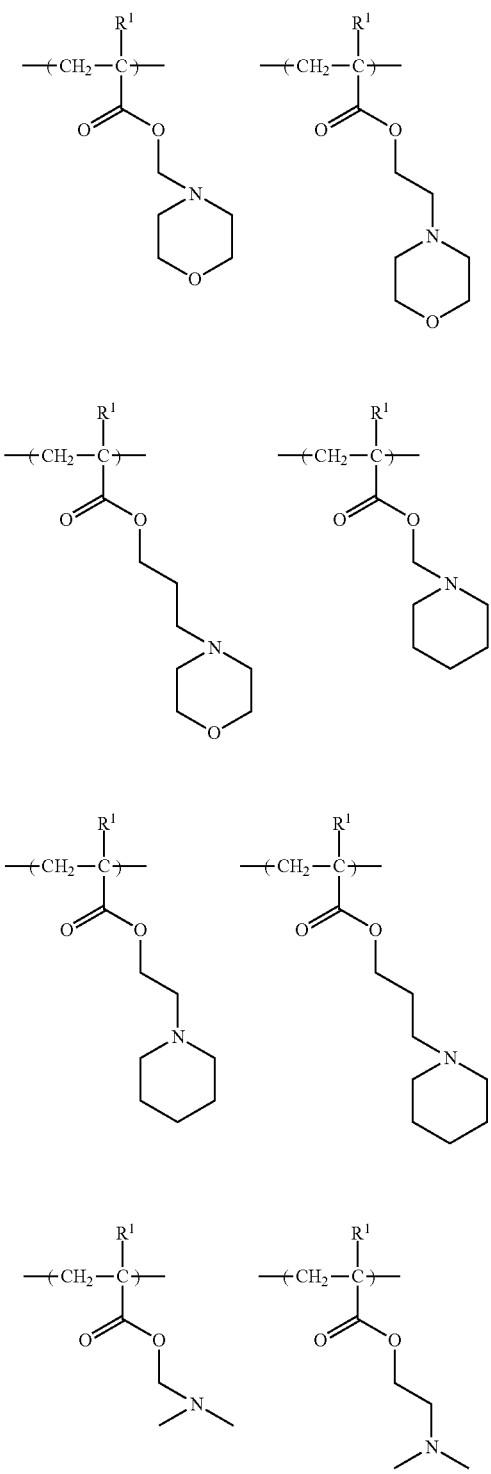
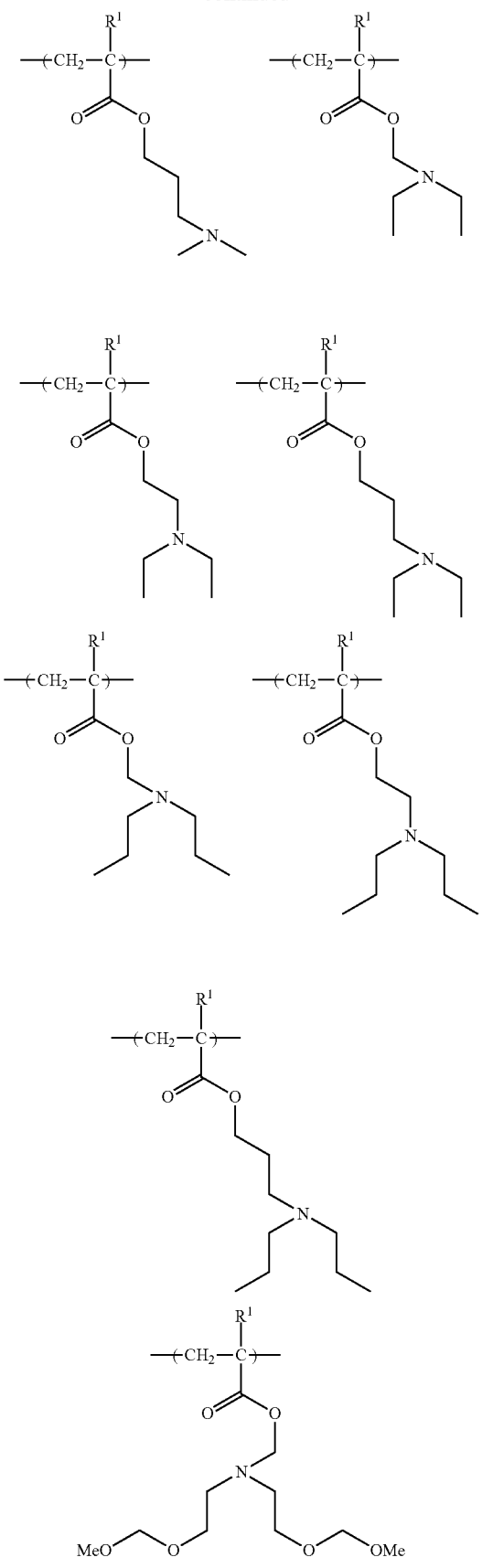

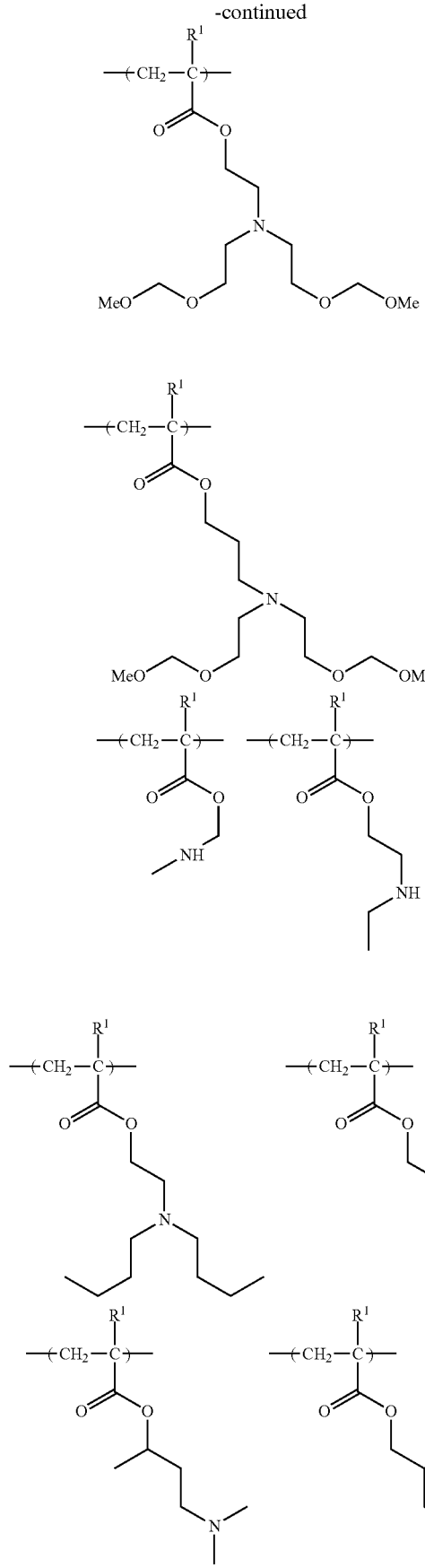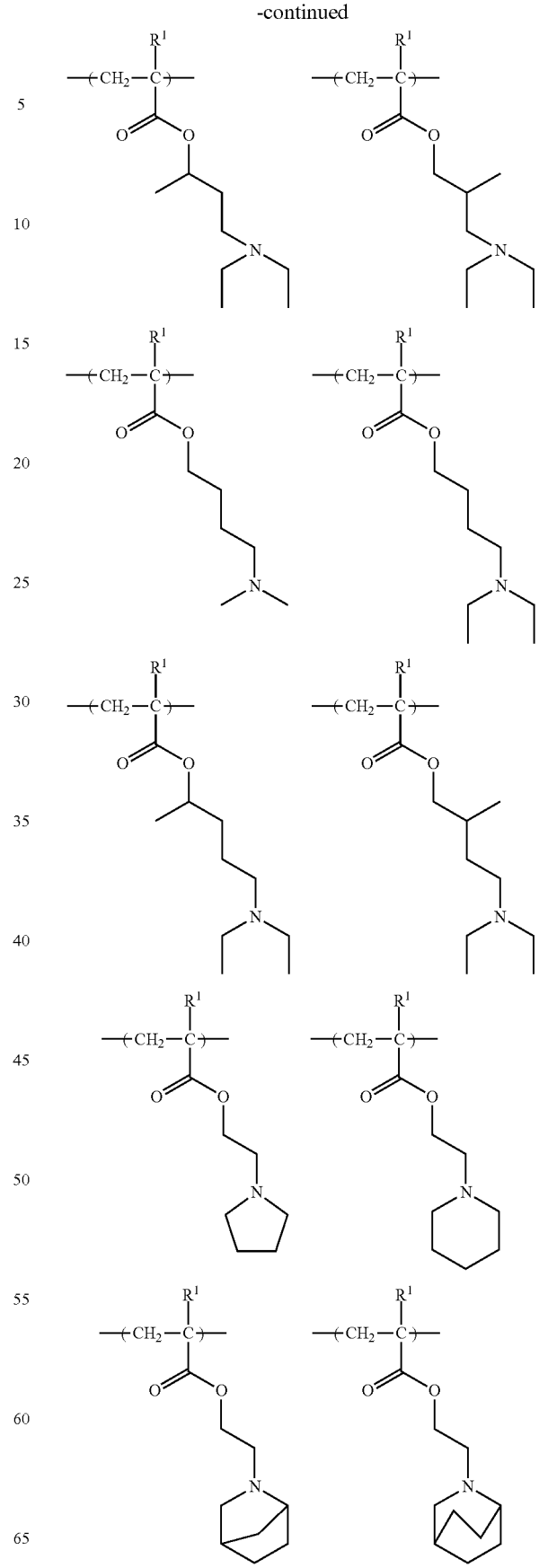

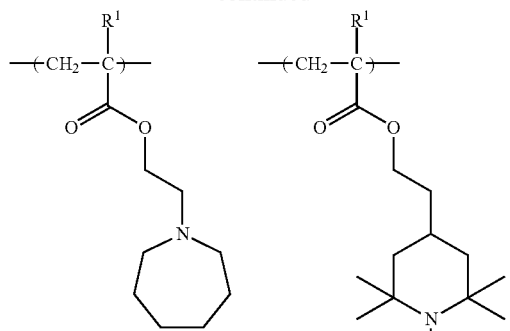
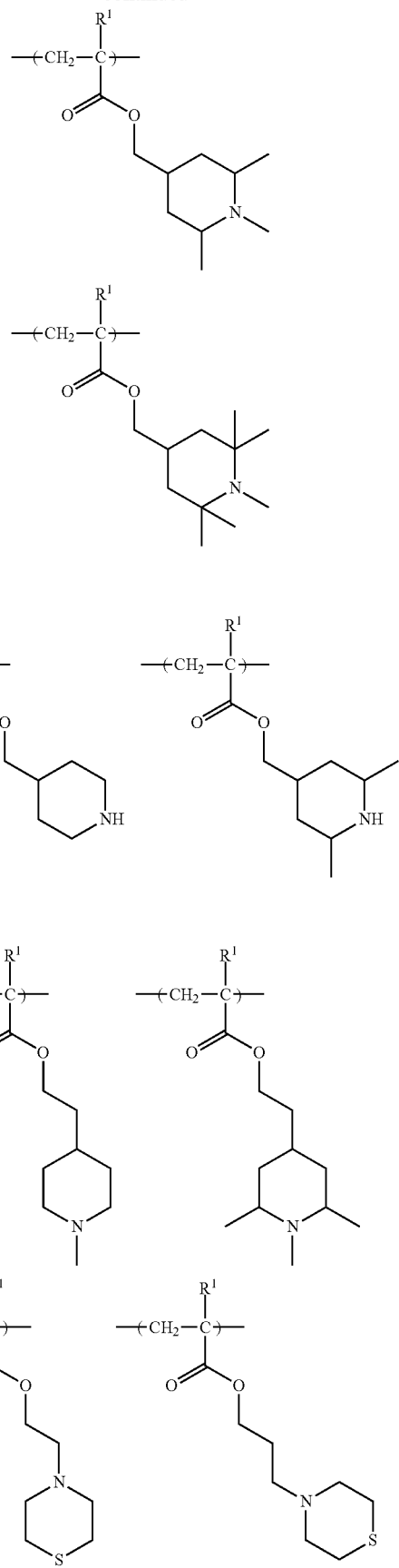

-continued

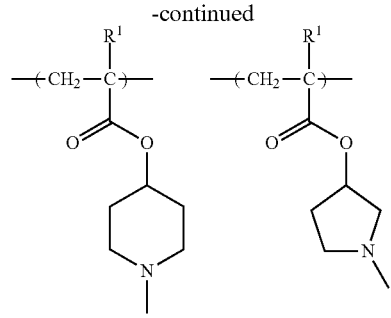
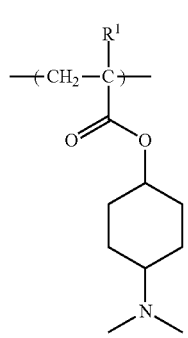
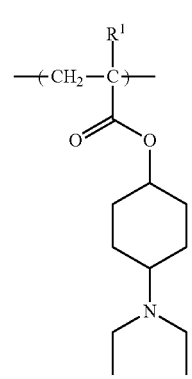

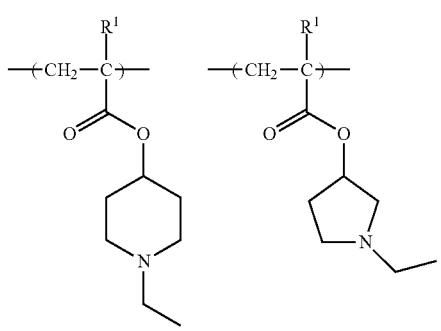
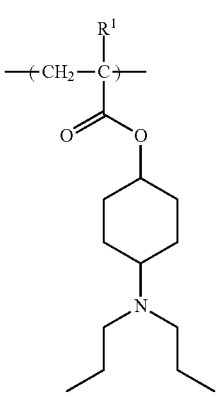
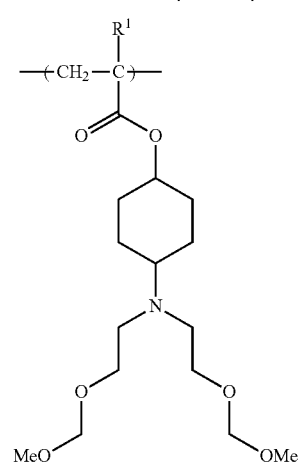

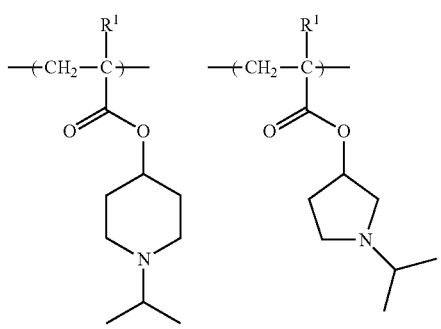

Preferred examples of the recurring units of formula (2) wherein q is 1, $B^1$ and $B^2$ are single bonds, $Z^1$ and $Z^2$ are single bonds, and $B^3$ is ethereal oxygen-containing alkylene are given below.

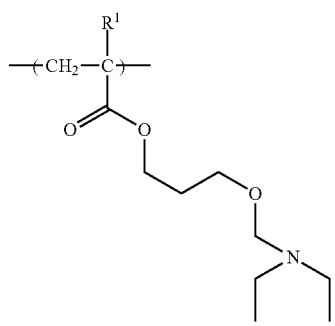

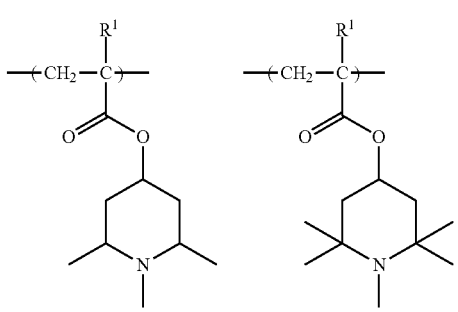
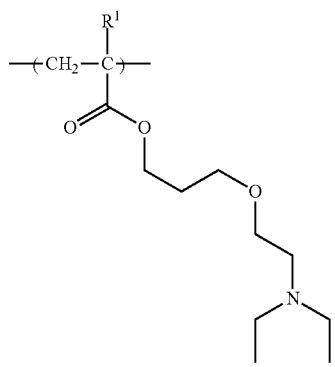

Preferred examples of the recurring units of formula (2) wherein q is 1, $B^1$ and $B^2$ are single bonds, $Z^1$ and $Z^2$ are single bonds, and $B^3$ is alicyclic are given below.

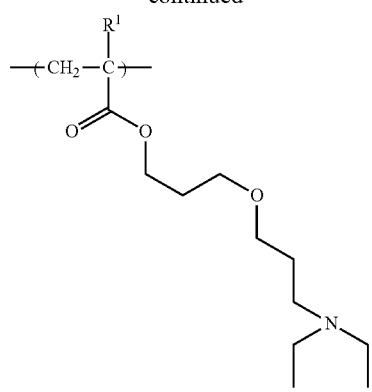
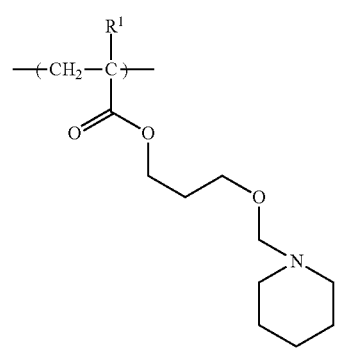
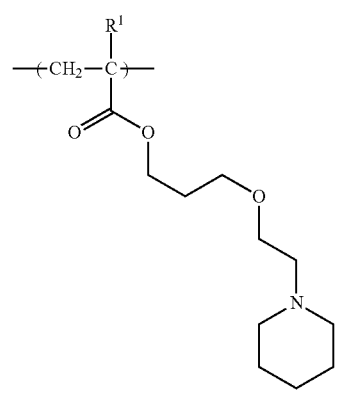
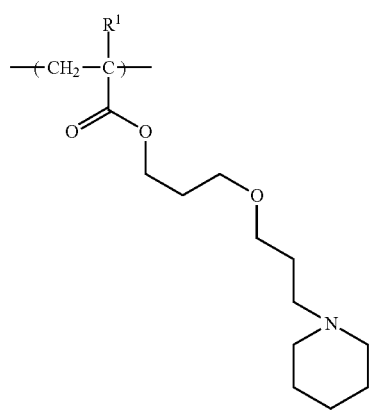
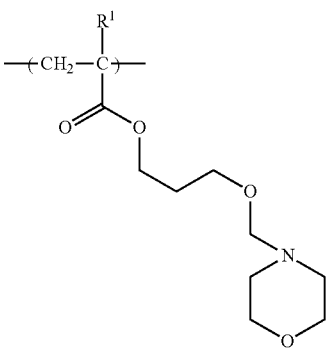
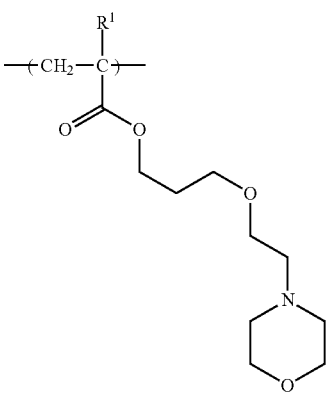
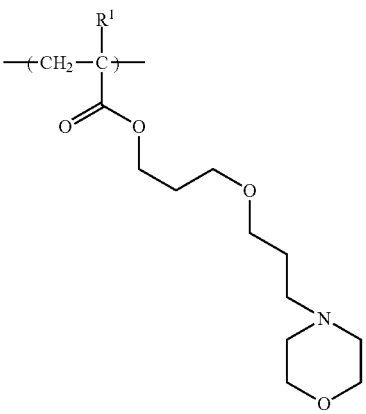
Preferred examples of the recurring units of formula (2) wherein q is 1, $B^1$ and $B^2$ are single bonds, $Z^1$ and $Z^2$ are single bonds, and $B^3$ is aromatic are given below.
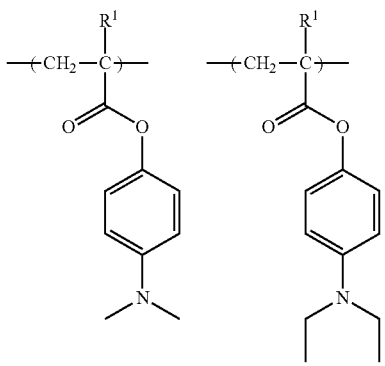

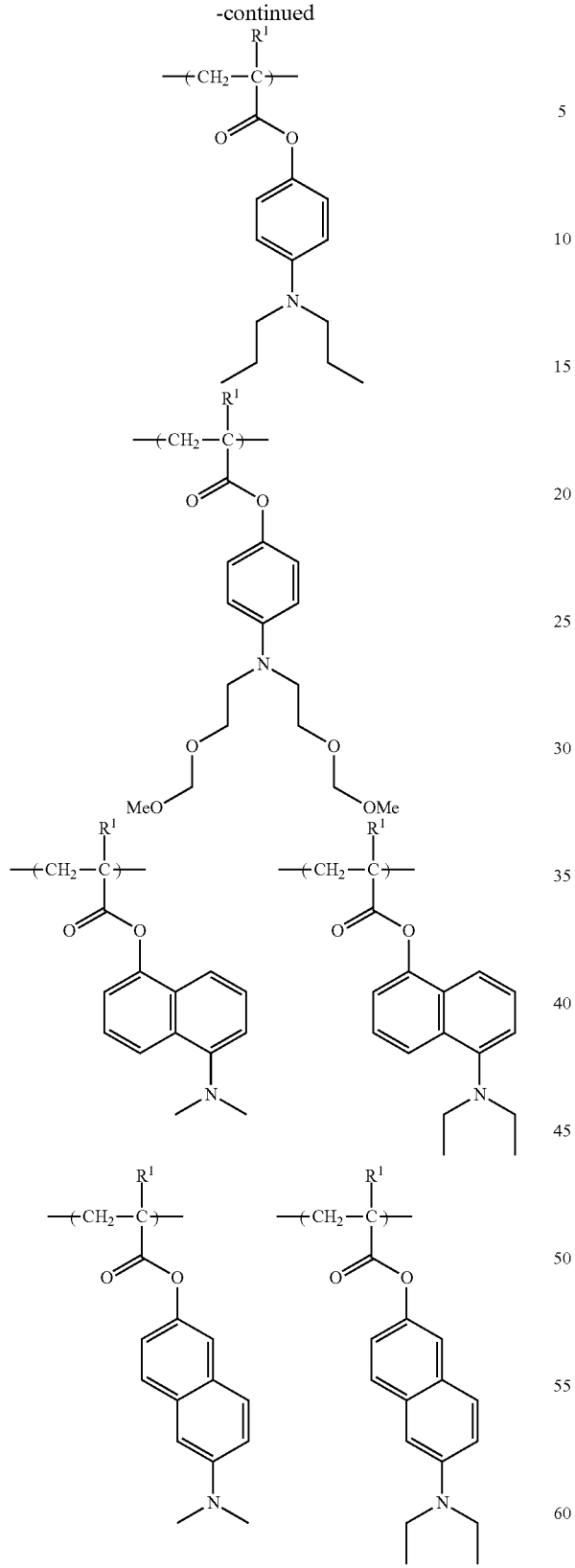
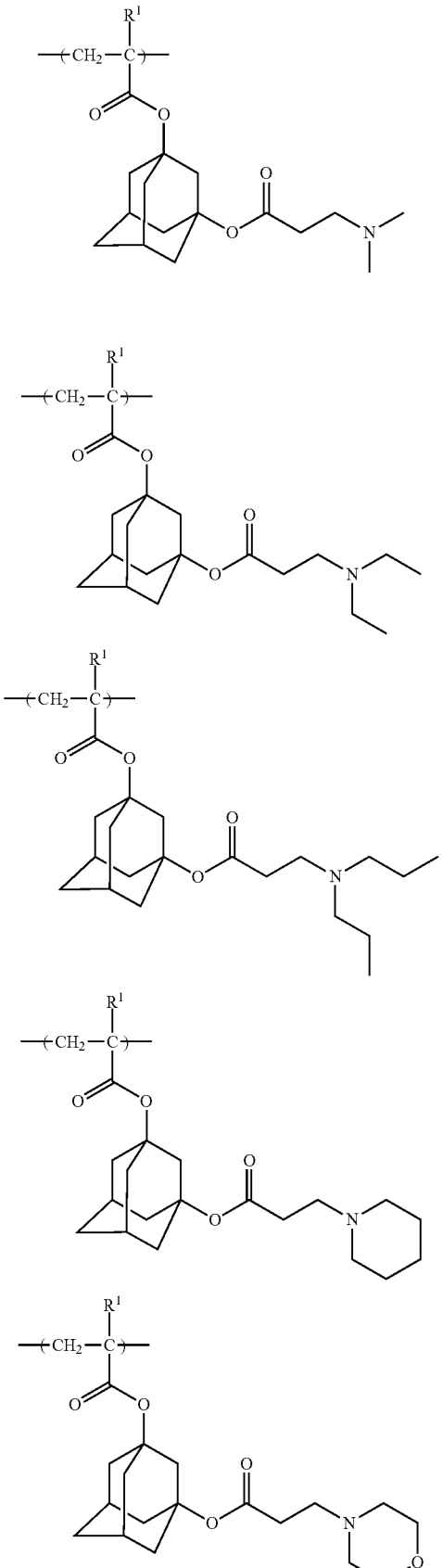
Preferred examples of the recurring units of formula (2) wherein q is 1, $B^1$ is a single bond, $Z^1$ is a single bond, $B^2$ is alicyclic, $Z^2$ is —O—CO— or —CO—O—, and $B^3$ is alkylene are given below.

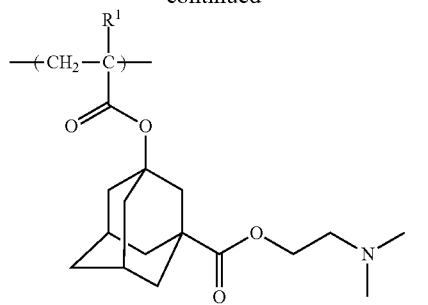
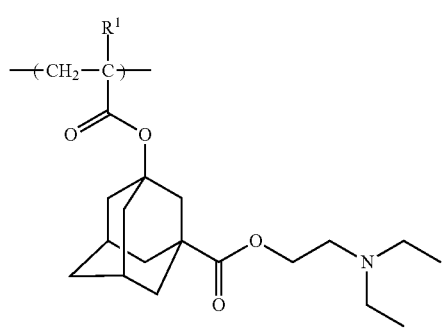
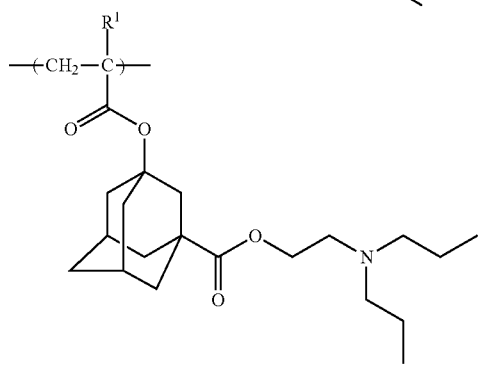
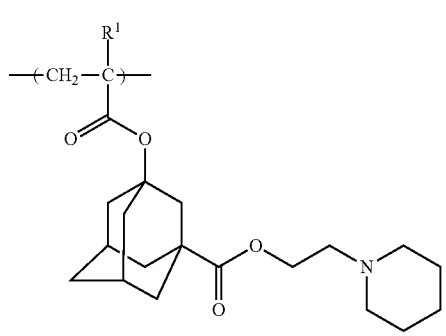
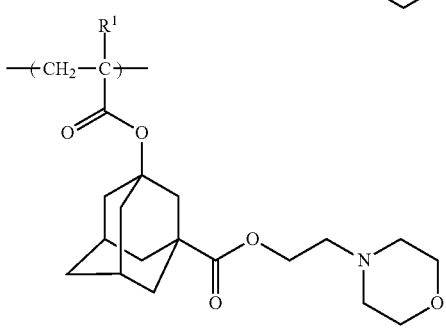
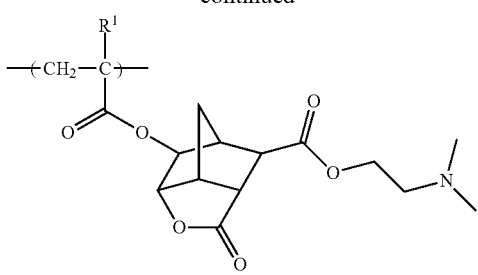
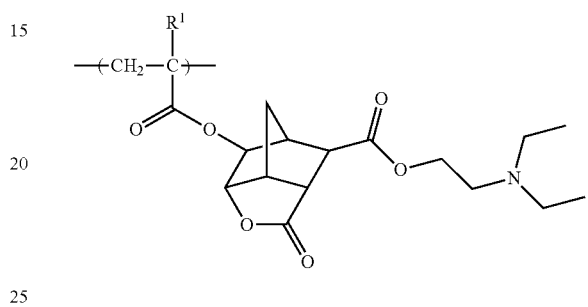
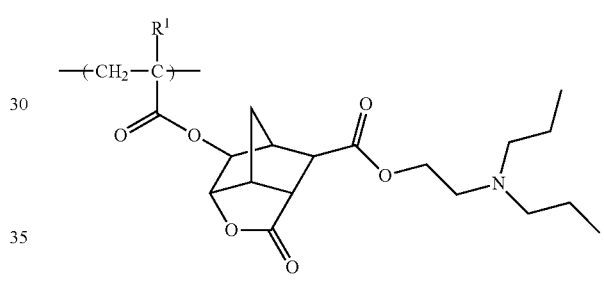
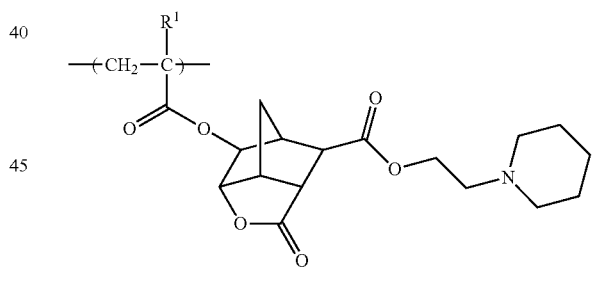
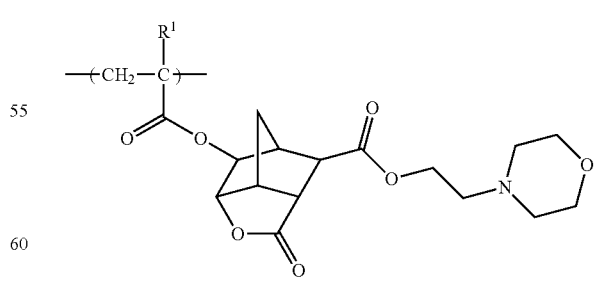
Preferred examples of the recurring units of formula (2) wherein q is 1, $B^1$ is a single bond, $Z^1$ is a single bond, $B^2$ is alkylene, $Z^2$ is —CO—O—, and $B^3$ is alkylene are given below.

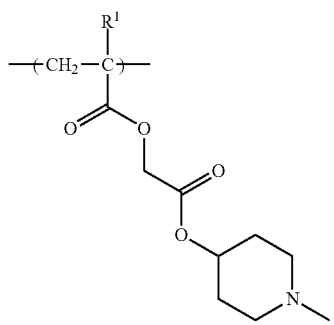
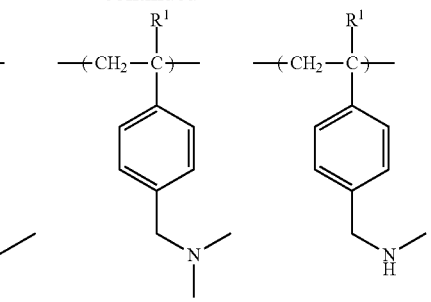
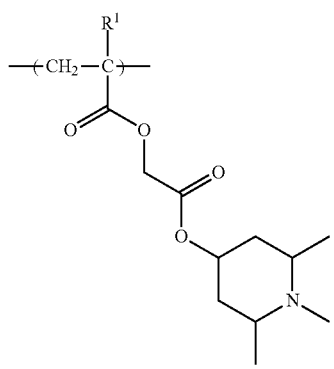
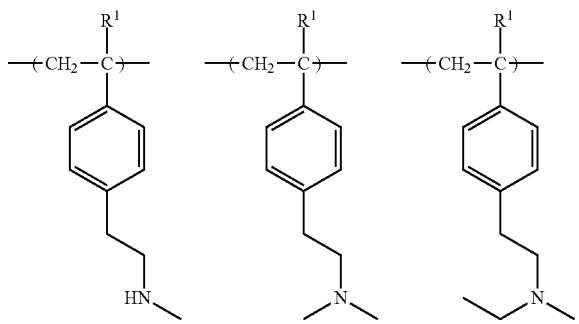
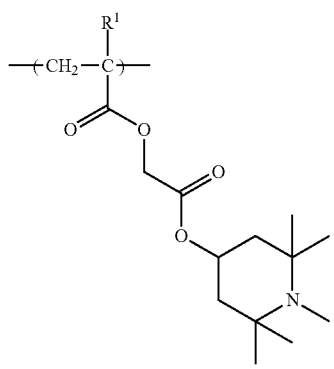
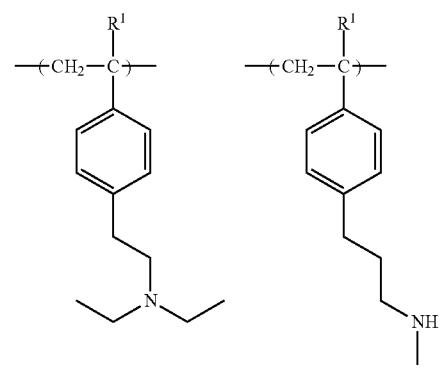
Preferred examples of the recurring units of formula (2) wherein q is 0, $B^1$ is a single bond, $Z^1$ is a single bond, $B^2$ is aromatic, $Z^2$ is a single bond, and $B^3$ is a single bond, alkylene or ethereal oxygen-containing alkylene are given below.
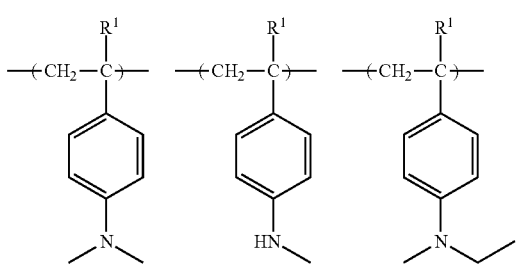
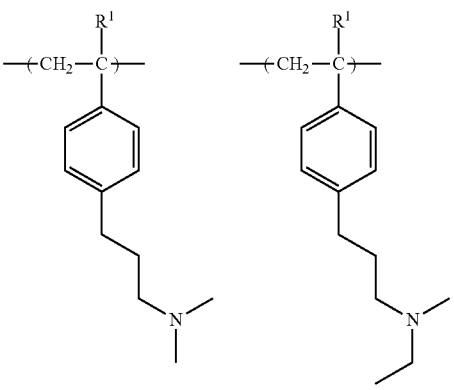

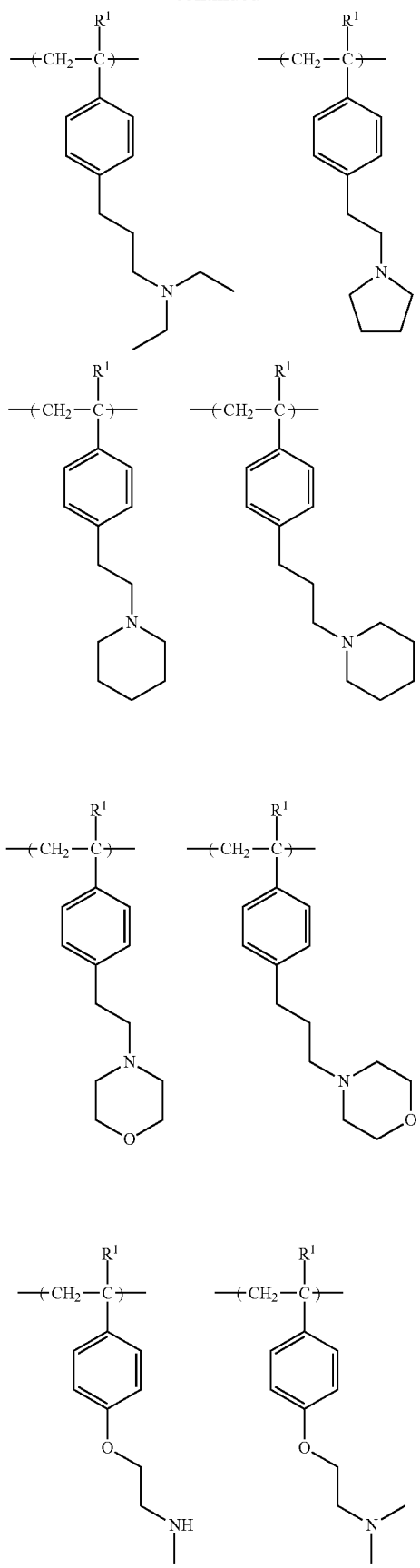
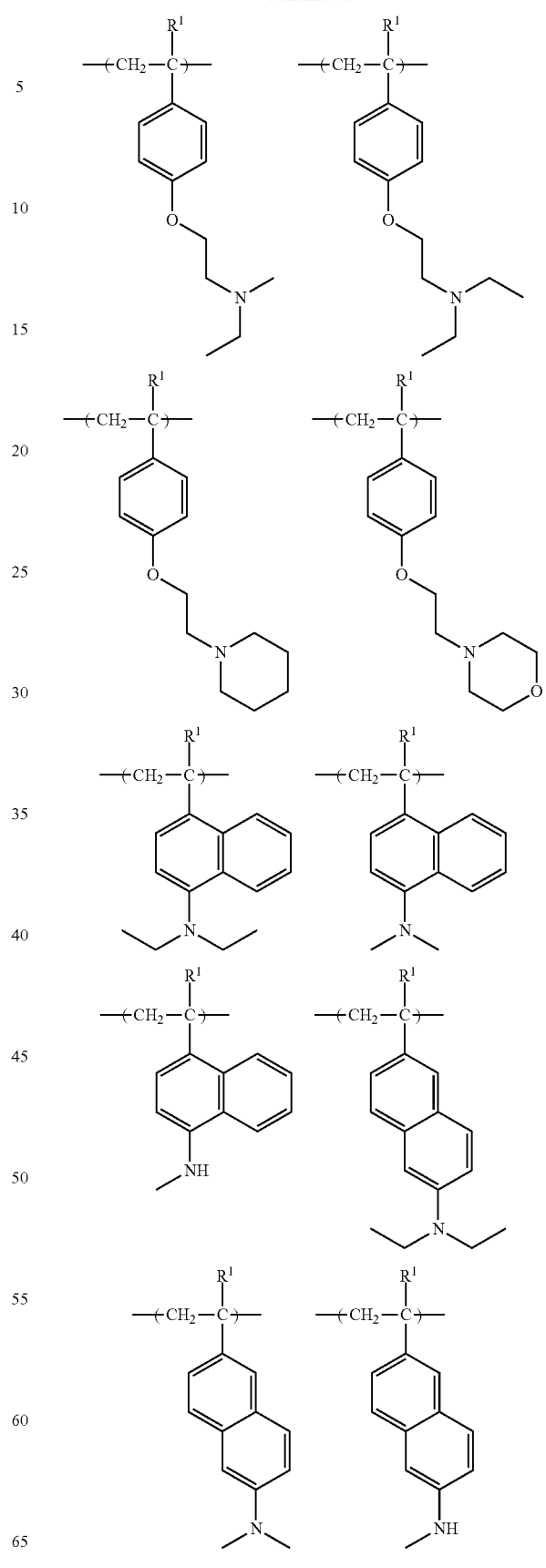

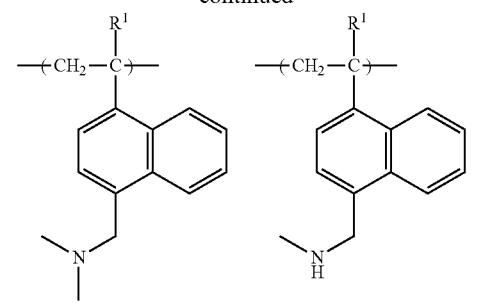
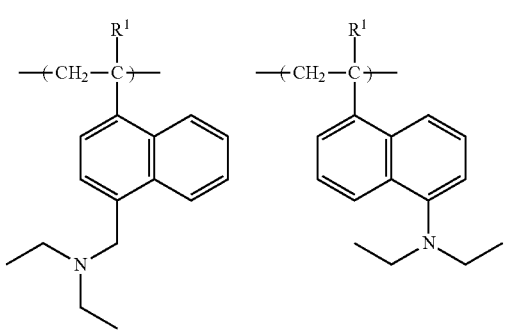
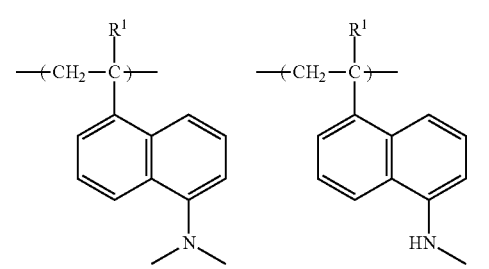
Preferred examples of the recurring units of formula (2) wherein q is 0, $B^1$ is a single bond, $Z^1$ is a single bond, $B^2$ is aromatic, $Z^2$ is —CO—O—, and $B^3$ is alkylene are given below.
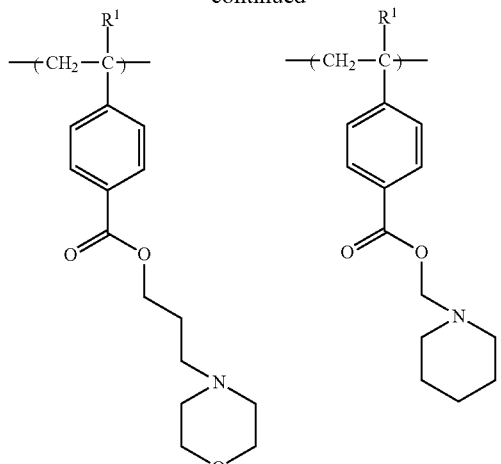
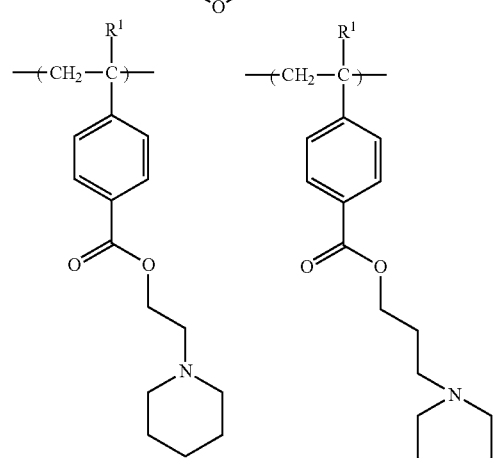
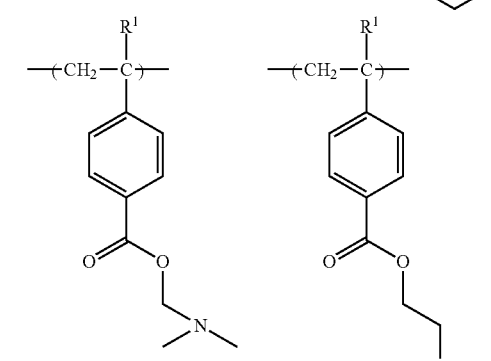
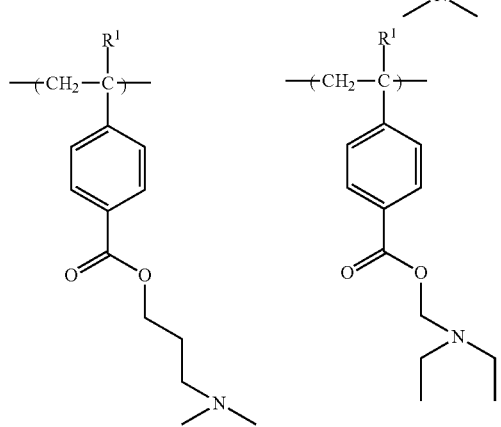

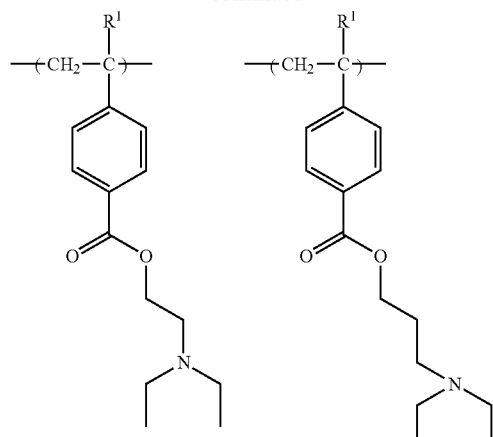
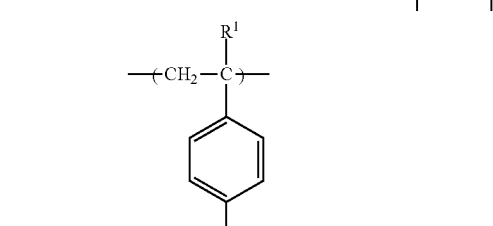
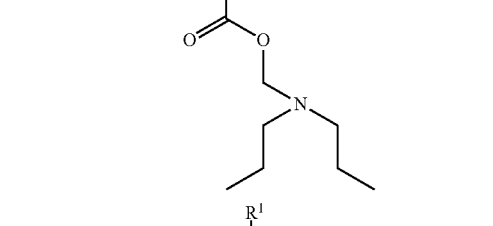
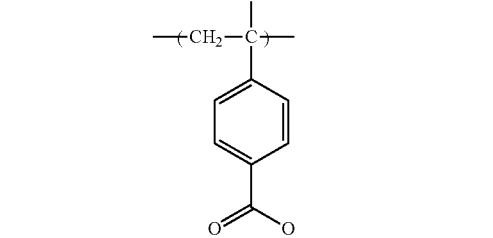
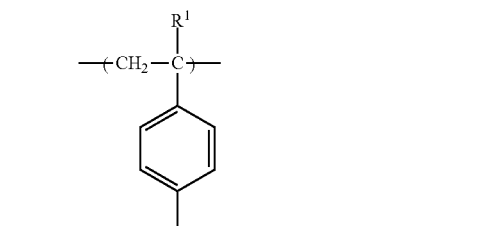
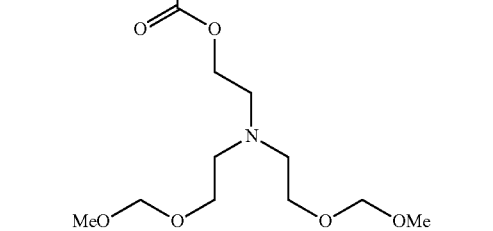
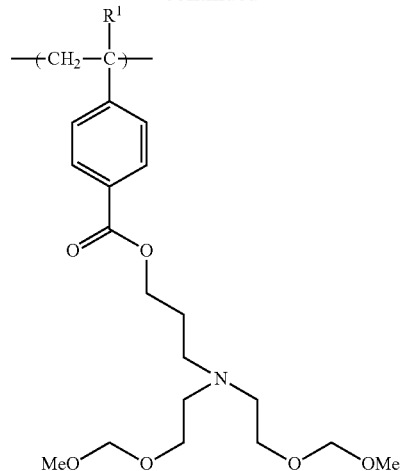
Preferred examples of the recurring units of formula (2) wherein q is 0, $B^1$ is aromatic, $Z^1$ is —CO—O—, $B^2$ is alicyclic, $Z^2$ is —CO—O— or —O—CO—, and $B^3$ is alkylene are given below.
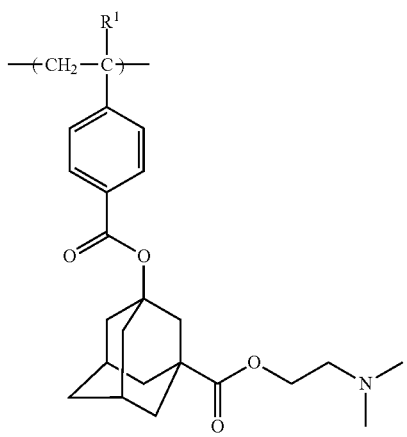

35
-continued
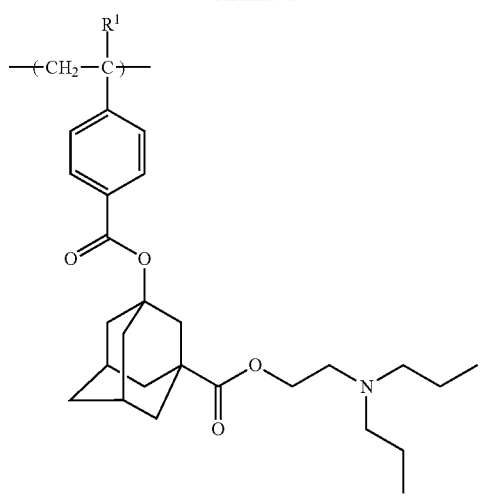
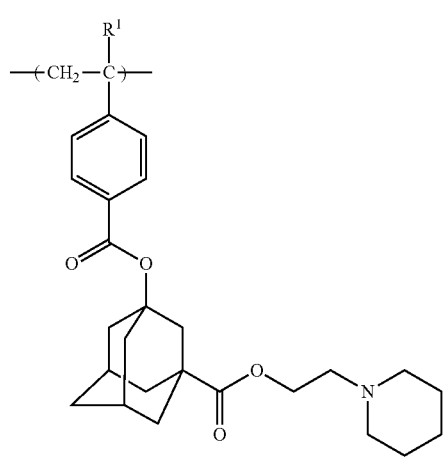
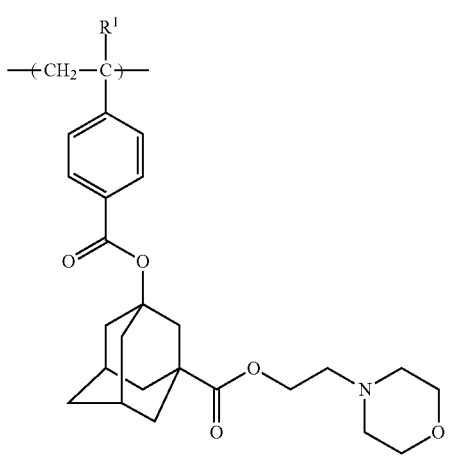
36
-continued
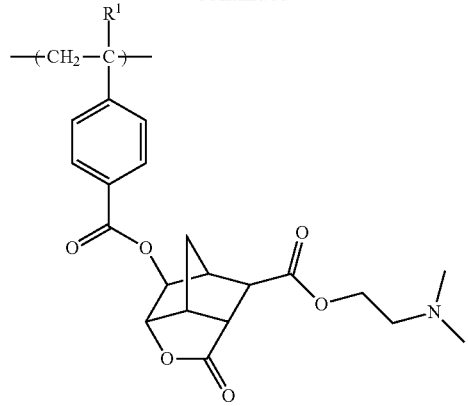
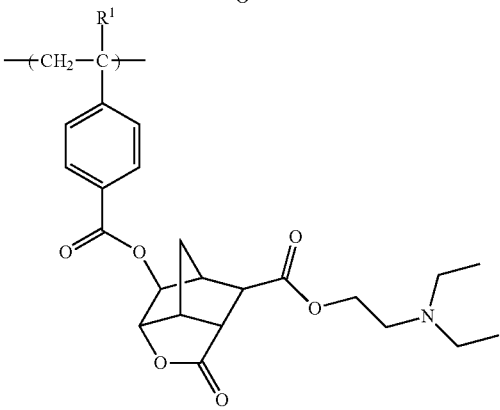
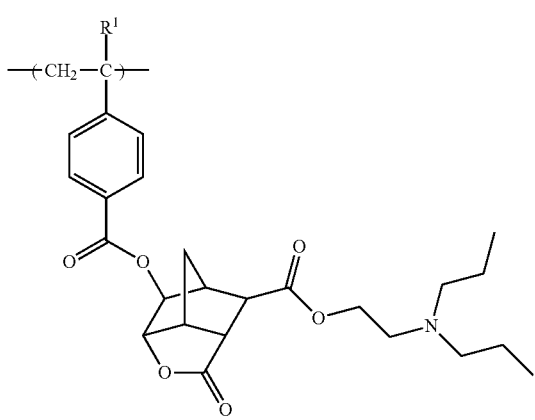
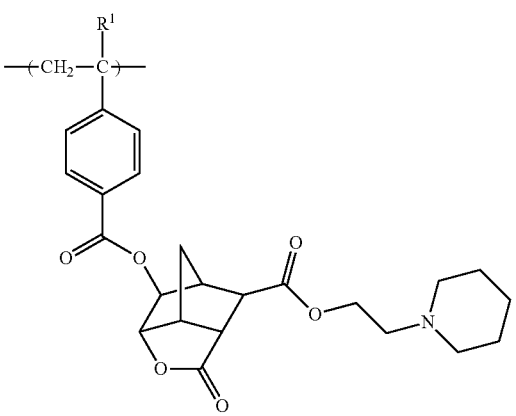

37
-continued
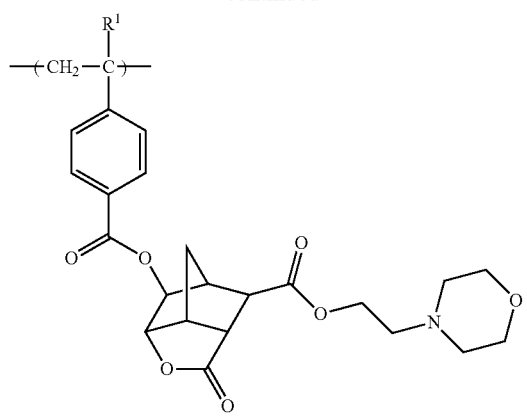
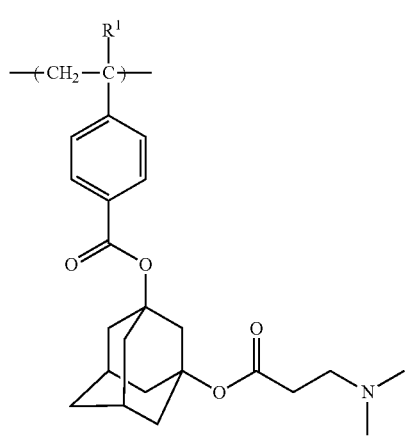
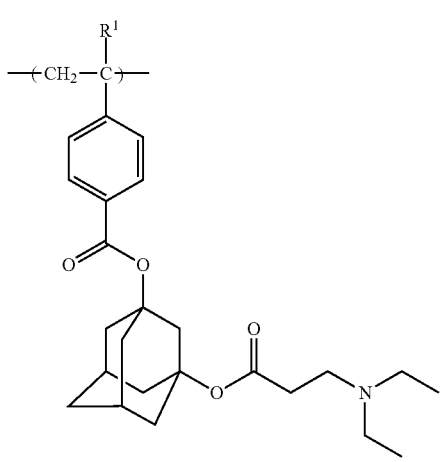
38
-continued
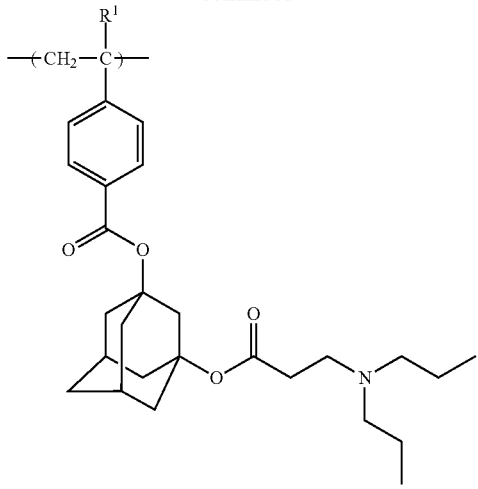
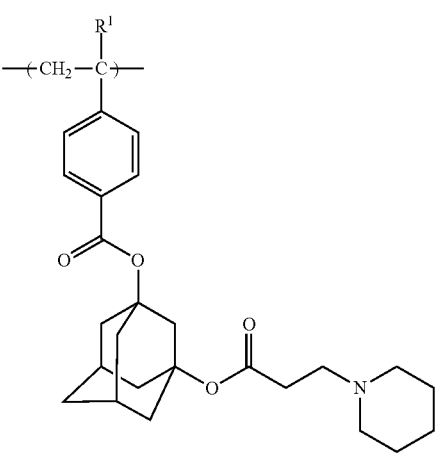
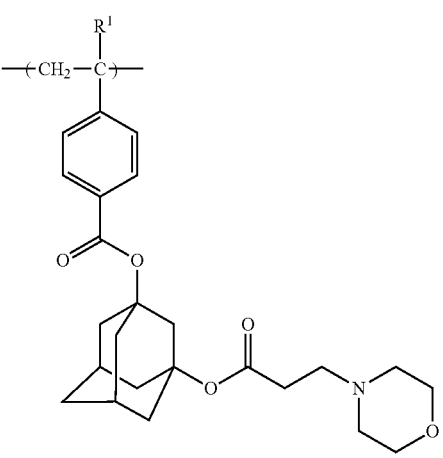
Preferred examples of the recurring units of formula (2) wherein q is 0, $B^1$ and $B^2$ are single bonds, $Z^1$ and $Z^2$ are single bonds, and $B^3$ is ethereal oxygen-containing alkylene are given below.

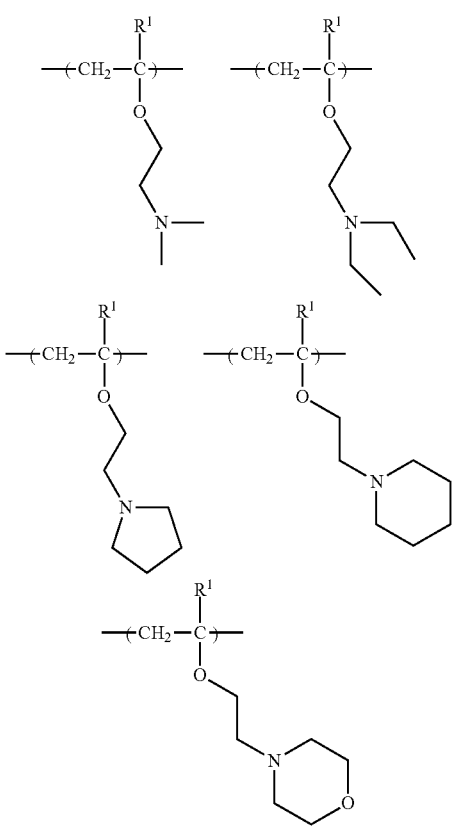

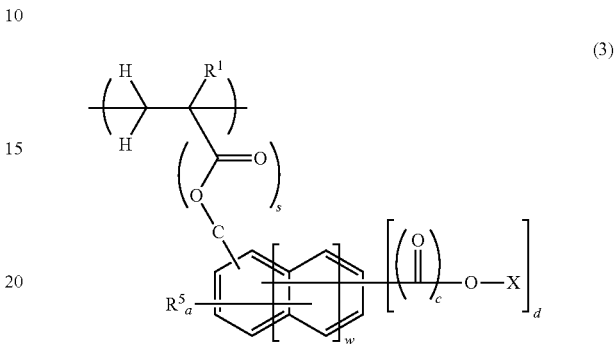

The polymer defined above as component (C) constitutes a part or the entirety of component (A) while component (A) is a single polymer or a blend of polymers wherein at least one polymer (one polymer, some polymers or all polymers) has a protective group which is deprotected with an acid so that a film of the polymer or polymer blend is insoluble in alkaline developer, but the film turns soluble in alkaline developer under the action of acid.

In the embodiment wherein component (A) is a polymer blend, the phrase that a film thereof is insoluble in alkaline developer, but turns soluble therein under the action of acid means that whether a polymer as a part of the polymer blend is itself soluble in alkaline developer even in the absence of acid or a polymer itself is insoluble in alkaline developer even under the action of acid, a resist film formed of the polymer blend is insoluble in alkaline developer prior to the action of acid, whereas under the action of acid, the acid labile protective group that one or more or all polymers possess is eliminated whereby the polymer blend becomes soluble in alkaline developer. Then, in the embodiment wherein the polymer defined as component (C) is used as a part of component (A), the polymer may be soluble in alkaline developer or the polymer as component (C) itself may be insoluble in alkaline developer even under the action of acid. In the latter case, however, the polymer which can otherwise be a cause of scum following development is preferably designed so as to avoid alkali insolubilization even after acid treatment. In the former case, since stricter limits are imposed on the polymer to be combined therewith as component (A), the polymer defined as component (C) is preferably a polymer further comprising recurring units having an acidic functional group protected with an acid labile protective group.

As the recurring units having an acidic functional group protected with an acid labile protective group, a number of units are well known including units having a phenolic hydroxyl group protected, and units in which a carboxyl group derived from vinyl benzoic acid or (meth)acrylic acid is protected. All these units are generally applicable.

Useful recurring units having an acidic functional group protected with an acid labile protective group which are incorporated in the polymer as component (C) include units of the general formula (3).

Herein C is a single bond or a $C_1$-$C_{10}$ alkylene group which may contain an ethereal oxygen atom. $R^1$ is hydrogen or methyl. $R^5$ is each independently a $C_1$-$C_6$ alkyl group. X is an acid labile group when d is 1. X is hydrogen or an acid labile group when d is 2 or 3, with at least one X being an acid labile group. The subscript "a" is an integer of 0 to 4, c is 0 or 1, d is an integer of 1 to 3, s is 0 or 1, and w is an integer of 0 to 2.

In formula (3), C stands for a single bond or a $C_1$-$C_{10}$ alkylene group which may contain an ethereal oxygen atom. Preferred alkylene groups are as exemplified for "A" in formula (1). $R^5$ is each independently a $C_1$-$C_6$ alkyl group. Preferred alkyl groups are as exemplified for $R^2$ in formula (1).

In formula (3), X is an acid labile group when d is 1, and is hydrogen or an acid labile group when d is 2 or 3, with at least one X being an acid labile group. The unit of formula (3) corresponds to the unit of formula (1) wherein at least one of phenolic hydroxyl groups substituting on an aromatic ring in the unit is replaced by an acid labile group, or at least one phenolic hydroxyl group is replaced by a carboxyl group which is in turn protected with an acid labile group. The acid labile group used herein may be any of acid labile groups which are eliminated with an acid to provide acidic groups, as commonly used in many well-known chemically amplified resist compositions.

Whether the phenolic hydroxyl group or the carboxyl group is to be protected, a choice of a tertiary alkyl group as the acid labile group for protection is preferred. The choice ensures that when a thin resist film which is as thin as 10 to 100 nm is processed to form a fine size pattern having a line width of up to 45 nm, the edge roughness of the pattern (a phenomenon that the edge of a pattern feature takes an irregular shape) is low. The tertiary alkyl group used herein is preferably selected from those of 4 to 18 carbon atoms because a corresponding monomer for polymerization can be isolated by distillation. The alkyl substituents on tertiary carbon of the tertiary alkyl group include straight, branched or cyclic alkyl groups of 1 to 15 carbon atoms which may partially contain an ether bond or an oxygen-containing functional group such as carbonyl while the substituents may bond together to form a ring.

The substituents on tertiary carbon of the tertiary alkyl group are preferably straight, branched or cyclic alkyl groups which may have an oxygen-containing functional group while the alkyl substituent groups on tertiary carbon may bond together to form a ring. Examples of the preferred substituents include, but are not limited to, methyl, ethyl, propyl, adamantyl, norbornyl, tetrahydrofuran-2-yl, 7-oxanorbornan-2-yl, cyclopentyl, 2-tetrahydrofuryl, tricyclo[5.2.1.0$^{2,6}$]decyl, 8-ethyl-8-tricyclo[5.2.1.0$^{2,6}$]decyl, 3-methyl-3-tetracyclo[4.4.0.1$^{2,5}$.1$^{7,10}$]dodecyl, tetracyclo[4.4.0.1$^{2,5}$.1$^{7,10}$]dodecyl, and 3-oxo-1-cyclohexyl. Examples of the tertiary alkyl group include t-butyl, t-pentyl, 1-ethyl-1-methylpropyl, 1,1-diethylpropyl, 1,1,2-trimethylpropyl, 1-adamantyl-1-methylethyl, 1-methyl-1-(2-norbornyflethyl, 1-methyl-1-(tetrahydrofuran-2-yl)ethyl, 1-methyl-1-(7-oxanorbornan-2-yl)ethyl, 1-methylcyclopentyl, 1-ethylcyclopentyl, 1-propylcyclopentyl, 1-cyclopentylcyclopentyl, 1-cyclohexylcyclopentyl, 1-(2-tetrahydrofuryl)cyclopentyl, 1-(7-oxanorbornan-2-yl)cyclopentyl, 1-methylcyclohexyl, 1-ethylcyclohexyl, 1-cyclopentylcyclohexyl, 1-cyclohexylcyclohexyl, 2-methyl-2-norbornyl, 2-ethyl-2-norbornyl, 8-methyl-8-tricyclo[5.2.1.0$^{2,6}$]decyl, 8-ethyl-8-tricyclo[5.2.1.0$^{2,6}$]decyl, 3-methyl-3-tetracyclo[4.4.0.1$^{2,5}$.1$^{7,16}$]dodecyl, 3-ethyl-3-tetracyclo[4.4.0.1$^{2,5}$.1]dodecyl, 2-methyl-2-adamantyl, 2-ethyl-2-adamantyl, 1-methyl-3-oxo-1-cyclohexyl, 1-methyl-1-(tetrahydrofuran-2-yl)ethyl, 5-hydroxy-2-methyl-2-adamantyl, and 5-hydroxy-2-ethyl-2-adamantyl.

Also an acetal group of the general formula (4):

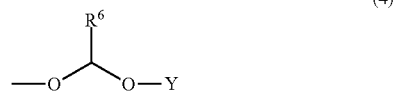

(4)

wherein R$^6$ is hydrogen or a straight, branched or cyclic C$_1$-C$_{10}$ alkyl group, and Y is a straight, branched or cyclic C$_1$-C$_{30}$ alkyl group (inclusive of polycyclic one) is often utilized. It is a good choice as the acid labile group that ensures consistent formation of a pattern which is relatively rectangular at the interface between the pattern and the substrate. In particular, a polycyclic alkyl group of 7 to 30 carbon atoms is preferably included to gain a higher resolution. When Y is a polycyclic alkyl group, preferably a bond forms between secondary carbon of the polycyclic ring structure and acetal oxygen. This is because if a bond forms on tertiary carbon of the ring structure, the polymer becomes an unstable compound, and as a result, the resulting resist composition may lack storage stability and have poor resolution. Inversely, if Y bonds on primary carbon via a straight alkyl group of at least 1 carbon, the polymer may have a low glass transition temperature (Tg), and as a result, the resist pattern as developed may suffer a profile failure by baking.

Examples of the acetal group of formula (4) are given below.

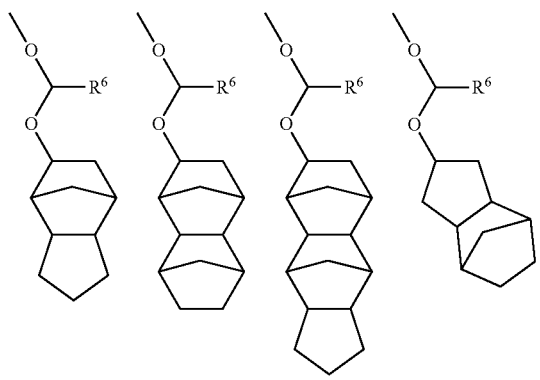

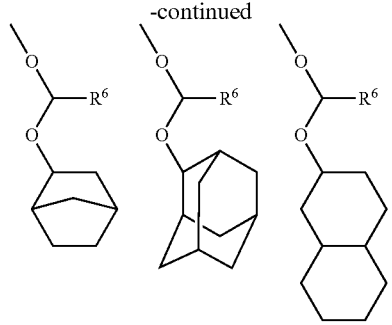

While R$^6$ is hydrogen or a straight, branched or cyclic C$_1$-C$_{10}$ alkyl group, a suitable group R$^6$ may be selected in accordance with the design of acid sensitivity of acid labile group. In one exemplary design that the acid labile group has a relatively high stability and is decomposable with a strong acid, hydrogen is selected as R$^6$. In another exemplary design that a higher sensitivity to pH changes is available due to relatively high reactivity, a straight alkyl group is selected as R$^6$. Partly depending on a combination of an acid generator and a basic compound compounded in a resist composition, in a further exemplary design that decomposition entails a large change of solubility due to terminal substitution with a relatively large alkyl group, R$^6$ is preferably a group in which the carbon bonding with the acetal carbon is secondary. Examples of R$^6$ which bonds with the acetal carbon via secondary carbon include isopropyl, sec-butyl, cyclopentyl, and cyclohexyl.

An alternative choice of acid labile group is bonding —CH$_2$COO— (tertiary alkyl group) to a phenolic hydroxyl group. This is an exceptional structure of acid labile group in that it is not a protective group for hydroxyl. The tertiary alkyl group used herein may be the same as the above-mentioned tertiary alkyl group used for the protection of a phenolic hydroxyl group.

In a preferred embodiment, the polymer as component (C) may further comprise recurring units for imparting an additional function. A variety of such units are known. For example, useful recurring units for imparting high etch resistance include units of the general formulae (5) and (6).

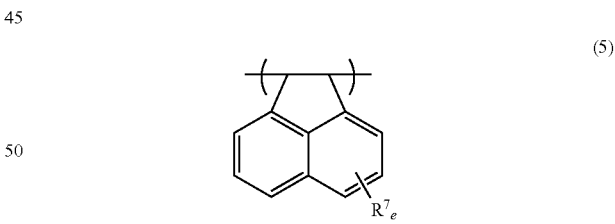

(5)

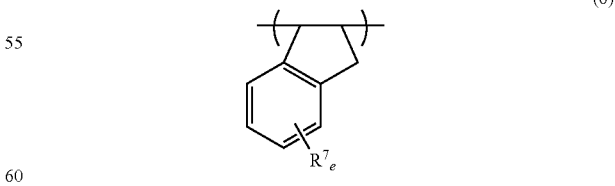

(6)

Herein e is an integer of 0 to 4, and R$^7$ is each independently a halogen atom, a hydroxyl group, a hydroxyl group protected with an acid labile group, optionally halo-substituted C$_2$-C$_7$ acyloxy group, optionally halo-substituted C$_1$-C$_6$ alkyl group, optionally halo-substituted C$_1$-C$_6$ alkoxy group, or optionally halo-substituted C$_2$-C$_7$ alkoxycarbonyl group.

For group $R^7$, exemplary halogen atoms include fluorine, chlorine and bromine. The alkoxy group and alkoxy moiety of alkoxycarbonyl group are preferably of 1 to 6 carbon atoms, more preferably 1 to 4 carbon atoms, and examples include methoxy, ethoxy, n-propoxy, isopropoxy, n-butoxy, isobutoxy, with methoxy and isopropoxy being preferred. Optionally substituted alkyl groups include straight, branched or cyclic alkyl groups such as methyl, ethyl, propyl, isopropyl, butyl, tert-butyl, pentyl, cyclopentyl, hexyl, cyclohexyl, and octyl, and substituted form of the foregoing alkyl groups in which one or more hydrogen atoms are substituted by halogen atoms or the like. Suitable acyloxy groups include methylcarbonyloxy, ethylcarbonyloxy, propylcarbonyloxy, butylcarbonyloxy, pentylcarbonyloxy, hexylcarbonyloxy and structural isomers thereof, cyclopentylcarbonyloxy, cyclohexylcarbonyloxy, benzoyloxy, and substituted form of the foregoing groups in which some hydrogen atoms are substituted by halogen atoms. When these groups are halo-substituted, chlorine or fluorine is preferred for substitution. Also $R^7$ is a hydroxyl group protected with an acid labile group, and in this case, the acid labile group may be selected from the examples enumerated for X in formula (3).

When units of formulae (5) and/or (6) are used as constituent units in the polymer, there are obtained the advantages that the aromatic ring provides etch resistance and the addition of cyclic structure to the main chain enhances resistance to EB irradiation during etching or pattern inspection.

In addition to the aforementioned recurring units, the polymer as component (C) may further comprise other recurring units insofar as they do not compromise the desired performance. Typically the other recurring units may be incorporated in a content of up to 20 mol % although the content varies depending on the identity of units. Suitable recurring units which can be incorporated include units derived from (meth)acrylate derivatives, vinyl ether derivatives, and aromatic vinyl compounds while functional groups include alcohols, lactones, and carboxylic acids protected with an acid labile protective group. Since numerous examples of these units are known from many patent documents, for example, Patent Documents 2 and 4, further detailed description thereof is omitted herein.

The polymer as component (C) may be designed as comprising the foregoing recurring units in a compositional ratio to be described below. The recurring units (1) contained in the polymer for endowing it with polarity are preferably incorporated in a content of at least 5 mol %, more preferably at least 30 mol %, although the content varies depending on the strength of polarity and fat solubility. From the aspect of solubility in alkaline developer, the preferred design is such that the total content of recurring units (1), recurring units (3), and one of the other recurring units, i.e., units derived from an acrylate derivative protected with an acid labile protective group is at least 35 mol %, more preferably at least 40 mol %. The recurring units (1) may be of one type or a mixture of two or more types. With respect to the upper limit of the content of recurring units (1), the polymer design largely differs depending on a particular embodiment wherein the polymer used in the resist composition is a single polymer, or a blend of polymers as component (C) is used, or the polymer used as component (A) is a polymer different from the polymer as component (C), that is, a polymer free of a basic side chain. With respect to the upper limit of the content of recurring units (1) in the polymer, the content of recurring units (1) may be quite high, and specifically, recurring units (1) may be all constituent units of the polymer excluding recurring units (2) when a blend of the polymer with another polymer is used as component (A).

With respect to the content of basic recurring units (2), the polymer design must be made between a proportion of these units in overall polymers in the resist composition (of which a resist film is made) and a proportion of these units in a single polymer. To attain the benefits of the invention, design is made such that the content of recurring units (2) is preferably 0.005 to 10 mol %, more preferably 0.01 to 3 mol %, and even more preferably 0.1 to 1.5 mol % based on the total recurring units in overall polymers in the resist composition. In an embodiment wherein all polymer as component (A) is the polymer as component (C) and the polymer is a single one, the content of basic recurring units (2) is preferably 0.005 to 10 mol %, more preferably 0.01 to 3 mol %, and even more preferably 0.1 to 1.5 mol % of the polymer.

When a blend of polymers is used as component (C) or a polymer different from the polymer as component (C), i.e., a basic side chain-free polymer is used as the polymer of component (A), a polymer having a compositional ratio deviating from the above range may be compounded. To maximize the content of recurring units (2), all recurring units excluding the necessary content of recurring units (1) may be recurring units (2). In general, a polymer having a content of recurring units (2) which is preferably up to 60 mol %, more preferably up to 50 mol % may be compounded, thereby achieving a satisfactory quench effect on resist pattern formation. The recurring units (2) may be of one type or a mixture of two or more types.

The recurring units (3) serve to make the resist film alkali insoluble and turn it alkali soluble under the action of acid. The recurring units (3) are not essential for the polymer as component (C) when a certain polymer different from the polymer as component (C) is used as a part of component (A) for controlling the solubility of the resist film in developer. However, the inclusion of recurring units (3) is preferred to ensure a degree of freedom in designing a blend of polymers. When included, the recurring units (3) are preferably incorporated in a content of more than 0 to 50 mol %, more preferably 10 to 45 mol % based on the overall recurring units of the polymer. The recurring units (3) may be of one type or a mixture of two or more types.

The recurring units (5) and (6) serve to improve etch resistance by imparting a cyclic structure to the main chain. The recurring units (5) and (6) each may be of one type or a mixture of two or more types. For the purpose of improving etch resistance, recurring units (5) and (6) are preferably incorporated in a content of at least 5 mol % based on the overall recurring units of the polymer. Where the functional group in recurring units (5) and (6) is polar so that the units serve to impart substrate adhesion or where the substituent group is protected with an acid labile group as mentioned above so that the units become alkali soluble under the action of acid, the content of recurring units (5) and (6) incorporated is added to the content of corresponding units so that the sum may fall in the above-defined range of corresponding units. Where recurring units (5) and (6) have no functional group or where the functional group is otherwise, the content of recurring units (5) and (6) incorporated is preferably up to 30 mol %. Where recurring units (5) and (6) have no functional group or the functional group is otherwise, a content of recurring units (5) and (6) in excess of 30 mol % may cause development defects.

While the polymer as component (C) comprises the foregoing recurring units as the main constituent units desirably in the above-defined contents, it may further comprise any commonly used, well-known recurring units as additional recurring units, specifically in a content of up to 30 mol %. Suitable additional recurring units include (meth)acrylate units protected with an acid labile group and (meth)acrylate units having an adhesive group such as lactone structure, as described in Patent Document 2. The properties of the resist film may be finely adjusted by controlling the content of the additional recurring units although the additional recurring units may be omitted.

The polymer comprising the foregoing recurring units may be prepared by effecting copolymerization of monomers by any well-known techniques with an optional combination of protection and deprotection reactions. The copolymerization reaction is preferably radical, anionic or coordination polymerization, but not limited thereto. With respect to the polymerization reaction, reference should be made to Patent Documents 7 to 9.

The polymer as component (C) preferably has a weight average molecular weight (Mw) of 1,000 to 50,000, and more preferably 2,000 to 20,000, as measured by gel permeation chromatography (GPC) using polystyrene standards. A polymer with a Mw of less than 1,000 may lead to a pattern having a rounded top, reduced resolution, and degraded LER as is well known in the art. If Mw is higher than the necessity, the pattern tends to have increased LER, depending on the pattern size to be resolved. The Mw is preferably controlled to 20,000 or less particularly when a pattern having a line width of up to 100 nm is formed.

The polymer preferably has a narrow dispersity as demonstrated by a molecular weight distribution Mw/Mn in the range of 1.0 to 2.0, more preferably 1.0 to 1.8. A broader dispersity may cause drawbacks to the pattern such as foreign matter after development and degraded profile.

Where the polymer (which is insoluble in alkaline developer, but turns soluble therein under the action of acid) used as component (A) in the resist composition is a single polymer or is blended with only a polymer falling in the concept of component (C), the resist composition generally contains no other polymers. Nevertheless, a polymer other than the polymer falling in the concept of component (C) may be added as a part of component (A).

With respect to the other polymer, that is, a polymer belonging to component (A), but not falling in the concept of component (C), any polymer may be used as long as a film of a blend of the other polymer with the polymer falling in the concept of component (C) is insoluble in alkaline developer, but turns soluble under the action of acid. Since the other polymer should not undergo phase separation when mixed with the polymer falling in the concept of component (C), a polymer comprising recurring units of analogous fundamental structure, but free of amino-containing recurring units is preferably selected.

For example, when a polymer comprising recurring units selected from formulae (1) to (3) is used for the EB or EUV lithography, a polymer comprising recurring units (1) and (3) is preferably selected as the other polymer belonging to component (A), but not falling in the concept of component (C). Since recurring units (5) and (6) may be handled as mutually analogous recurring units (though their analogy needs not be strict), a heterogeneous combination like a combination of a polymer comprising recurring units mostly derived from a (meth)acrylic acid monomer with a polymer comprising recurring units mostly derived from a styrene monomer is undesirable.

Whether the polymer used in the resist composition is a blend of polymers falling in the concept of component (C), or a blend of a polymer falling in the concept of component (C) with another polymer not falling in the concept of component (C), but belonging to component (A), or a single polymer falling in the concept of component (C), the polymer as component (A) is designed as a whole to comprise respective recurring units in a proper compositional ratio so as to provide a solubility change in alkaline developer and substrate adhesion as required for the polymer to be formulated in chemically amplified positive resist compositions. While the preferred compositional ratio of recurring units (2) is as defined above, the overall polymer used as component (A) which is composed mainly of recurring units (1) to (3), (5) and (6) is designed such that the content of recurring units (1) is preferably 30 to 90 mol %, more preferably 40 to 85 mol %, the content of recurring units (3) is preferably 5 to 50 mol %, more preferably 10 to 45 mol %, and the total content of recurring units (1) plus recurring units (3) is preferably at least 40 mol %, based on the total recurring units of the overall polymer belonging to component (A). Where the functional group represented by $R^7$ in recurring units (5) and (6) is neither a hydroxyl group nor a hydroxyl group protected with an acid labile group, the total content of recurring units (5) and (6) is preferably up to 30 mol %. Where the functional group represented by $R^7$ is a hydroxyl group or a hydroxyl group protected with an acid labile group, the content of recurring units (5) and (6) is added to the content of recurring units (1) or (3) so that the sum may fall in the preferred range of recurring units (1) or (3) defined above.

Shown below are exemplary combinations of recurring units that constitute a polymer not falling in the concept of component (C) which is preferred for blending with the polymer comprising recurring units (1) to (3) and optionally recurring units (5) and (6) as constituent units, that is, the polymer falling in the concept of component (C).

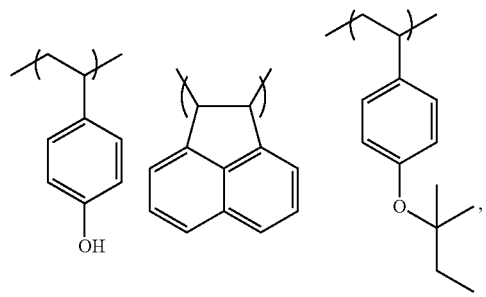

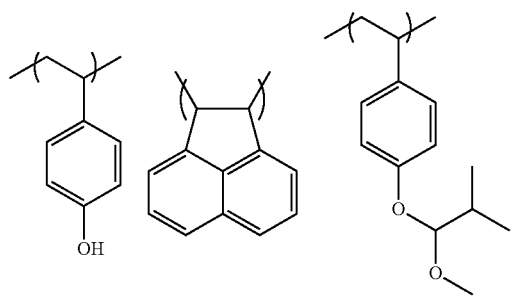

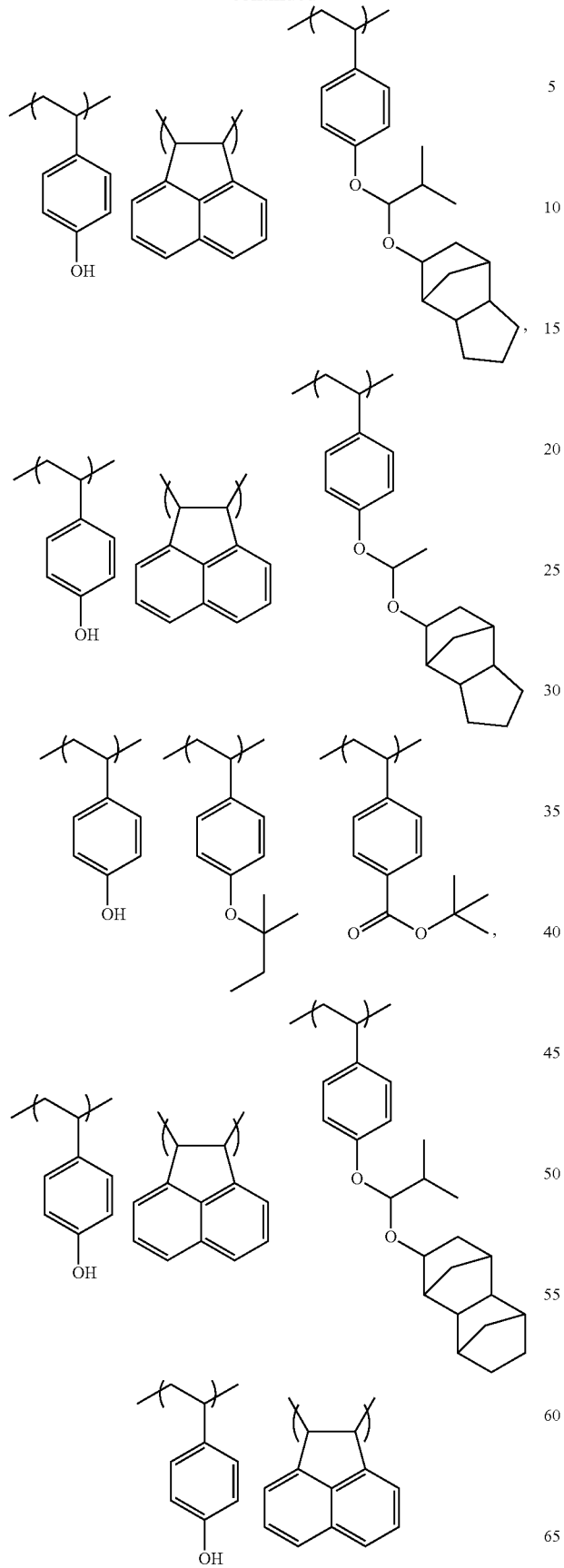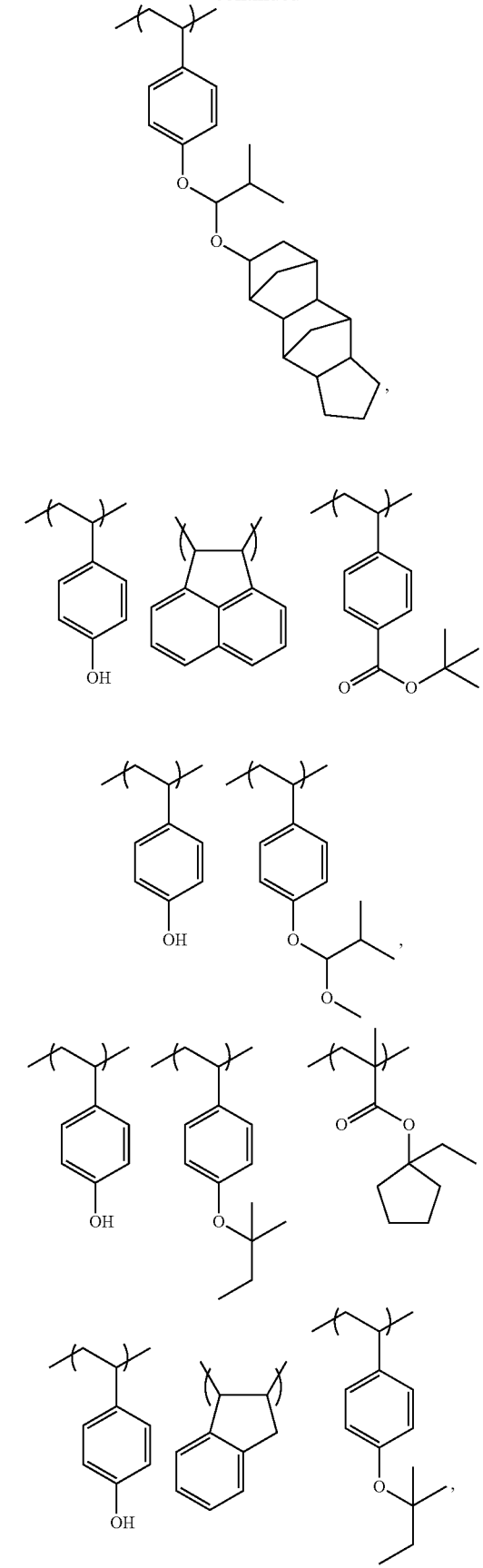

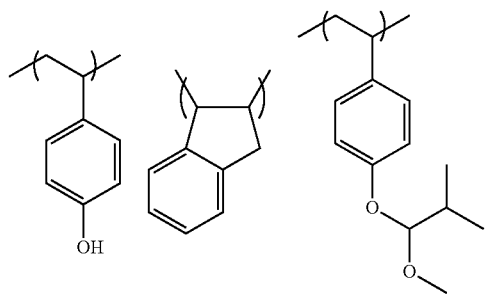
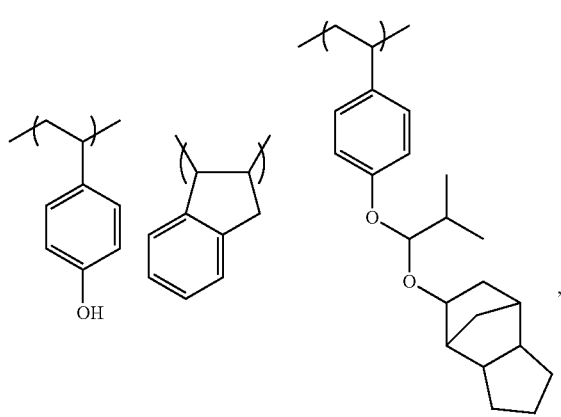
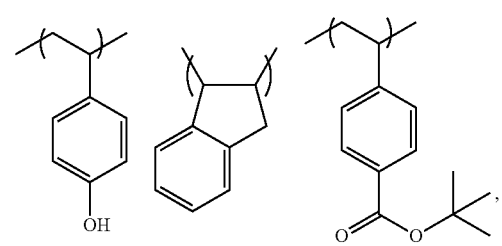
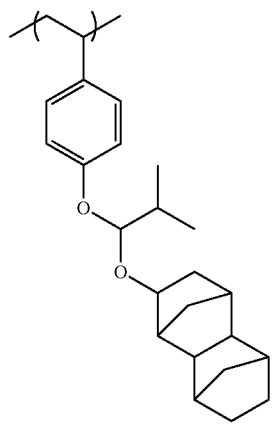
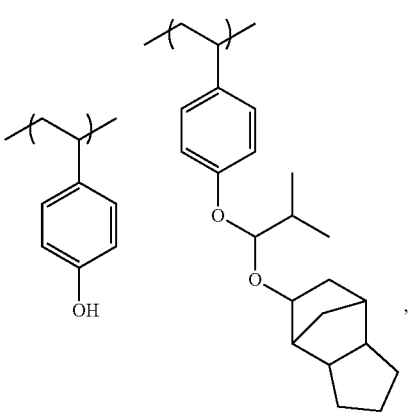
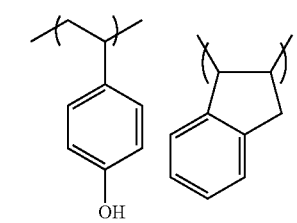
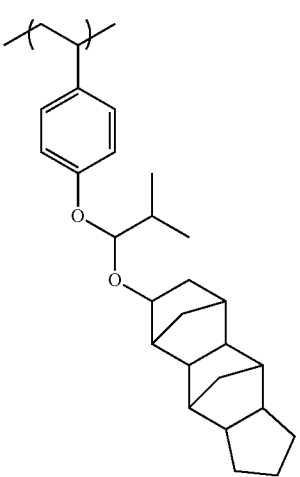

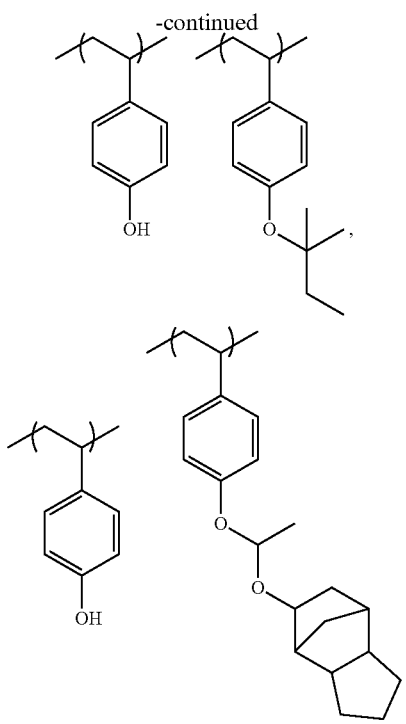

Blending a large amount of a polymer not falling in the concept of component (C) may cause to increase roughness because of a microscopic localization of units having a basic function. To exert the maximum effect in theory, it is desirable that all the polymer used in the resist composition be a polymer comprising recurring units having a secondary or tertiary amine structure. However, it is believed that the undesired diffusion phenomenon of a basic substance which occurs due to solvent evaporation upon resist film formation and the surface energy of substrate and resist film when a basic substance having a low molecular weight of up to 1,000 is used is prevented by converting the basic substance to a high molecular weight form. In fact, even when a certain amount of a polymer not falling in the concept of component (C) is added to a resist composition, a resist pattern resulting from a resist film of the resist composition is observed to exert the roughness reducing effect.

Then, when another polymer belonging to component (A), but not falling in the concept of component (C) is blended with the polymer comprising recurring units having a secondary or tertiary amine structure, the content of the other polymer belonging to component (A), but not falling in the concept of component (C) is preferably up to 99.5 parts, more preferably up to 99 parts by weight per 100 parts by weight of the overall polymers in the resist composition. If the content of the other polymer belonging to component (A), but not falling in the concept of component (C) is above the range (leading to excessive localization of the basic polymer), the resist may suffer a loss of resolution and an increase of roughness.

Component (B) is an acid generator. It is a compound which is decomposed to generate an acid upon exposure to high-energy radiation. A number of acid generators are known for use in chemically amplified resist compositions, as described in Patent Documents 1 to 4, for example. Generally any of these acid generators may be used. For use in the EB and EUV lithography, sulfonium acid generators are useful, and a number of suitable compounds are also known. Further, the sulfonium acid generator may take the form of a polymer having the acid generator incorporated in a side chain from its recurring unit as described in Patent Document 6.

Preferred examples of the acid generator are illustrated below, but not limited thereto. First shown are examples of the acid generator as component (B) which is not incorporated in a polymer.

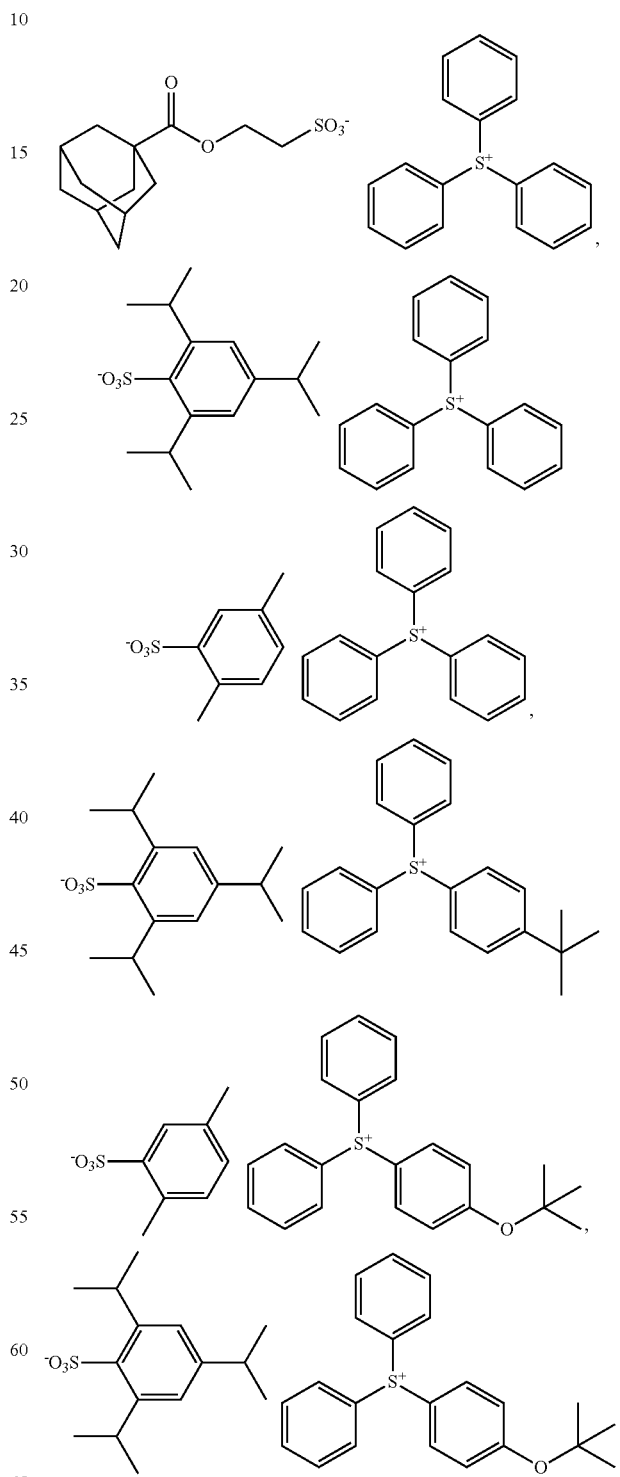

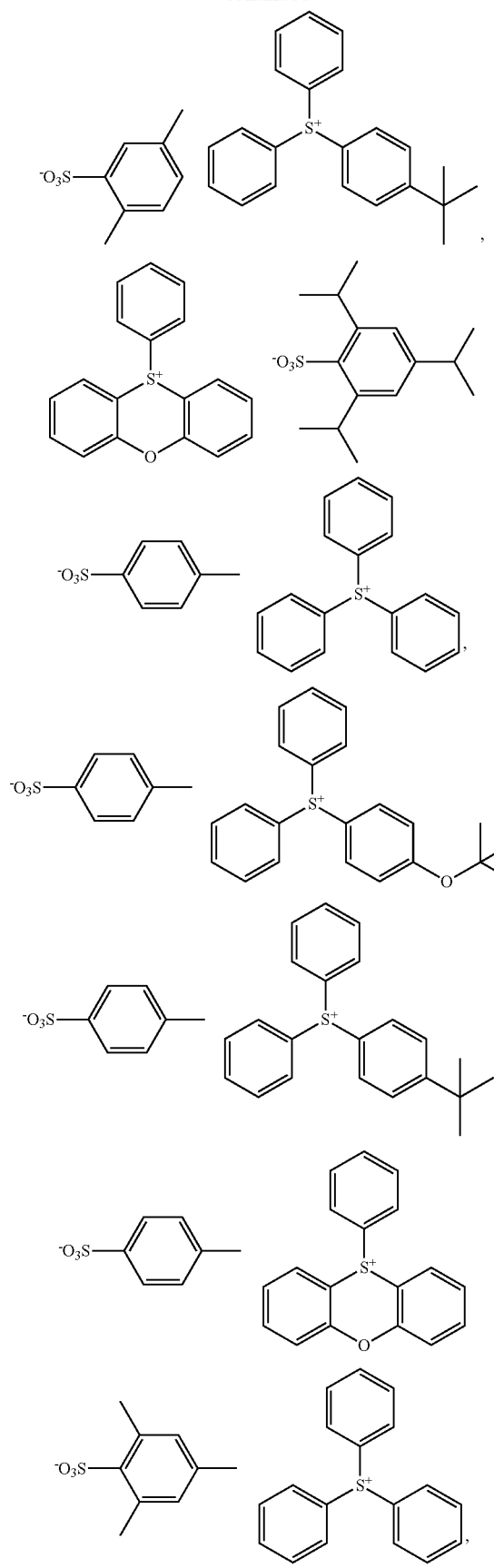
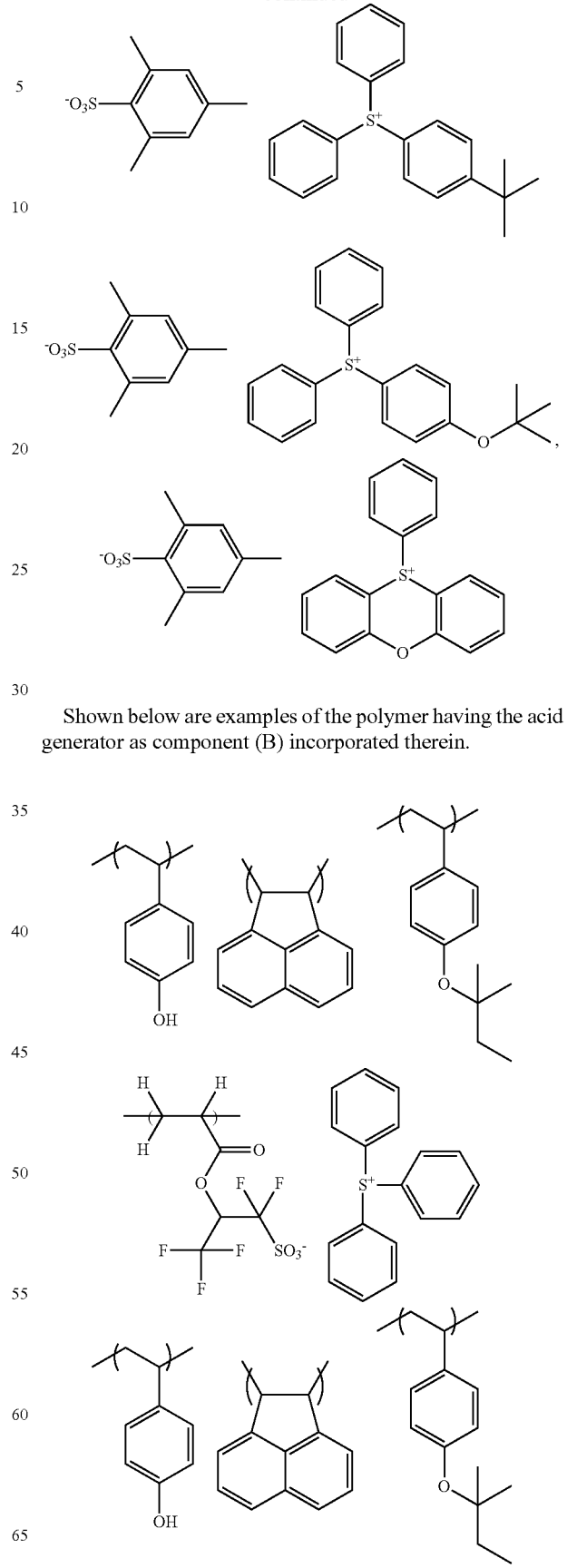
Shown below are examples of the polymer having the acid generator as component (B) incorporated therein.

55
-continued
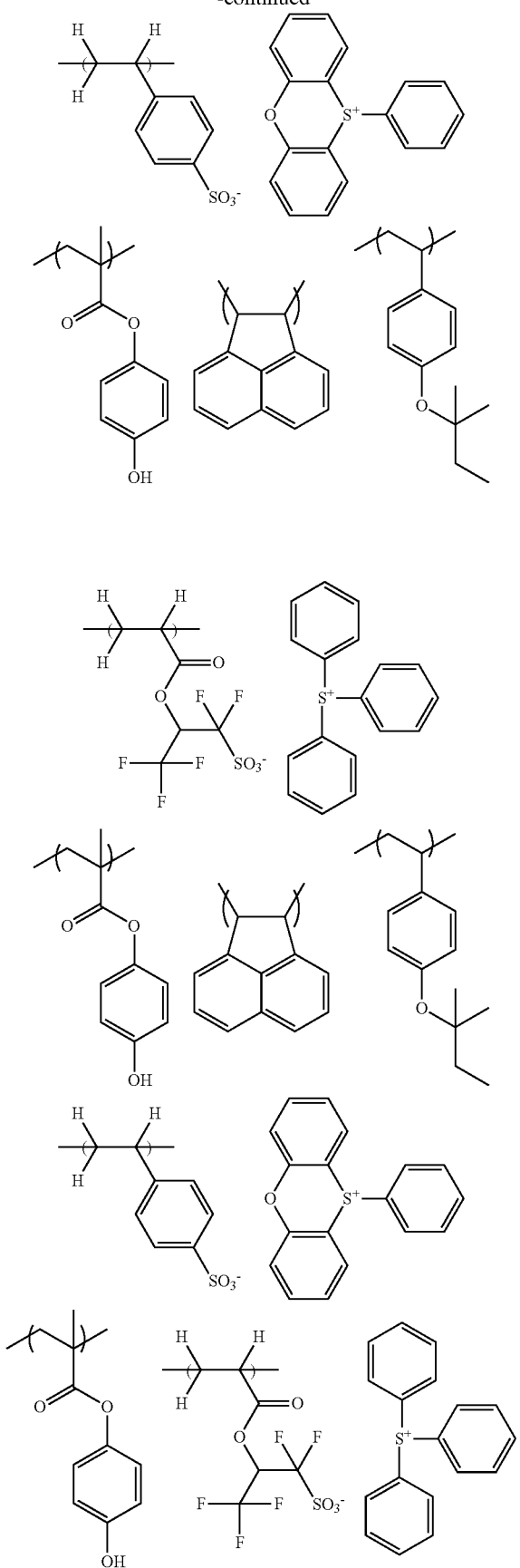
56
-continued
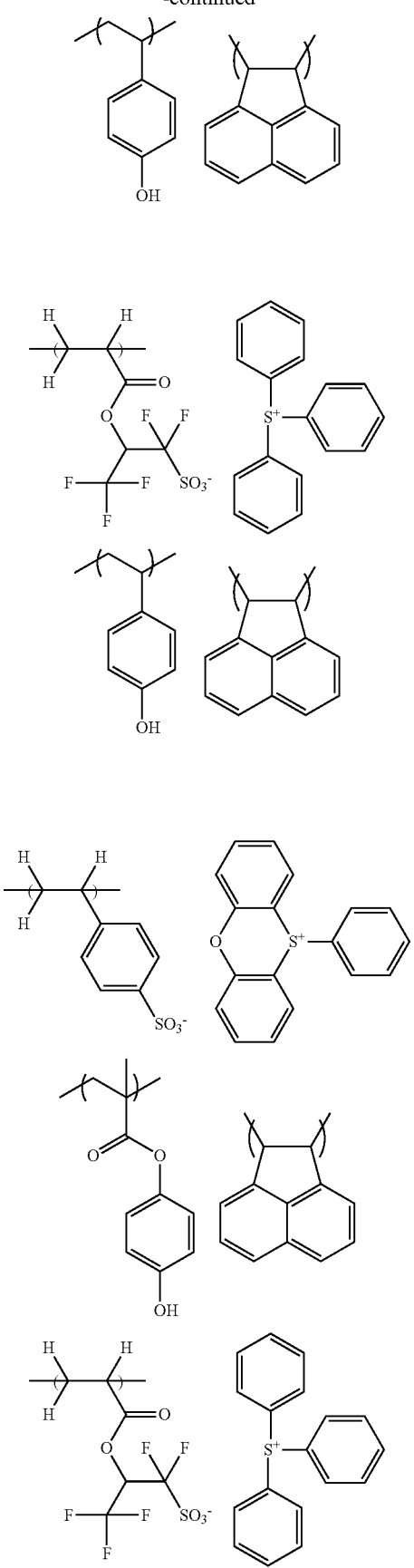

-continued

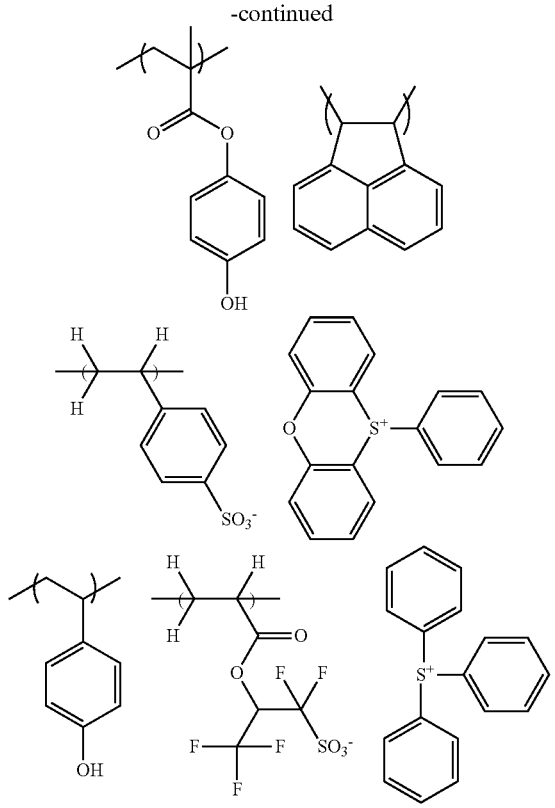

Although the amount of the PAG added to the positive resist composition is not particularly limited, any of well-known acid generators may be selected and used in a suitable amount as described, for example, in Patent Documents 1 to 5. The PAG is preferably added in an amount of 0.1 to 15 parts, more preferably 2.0 to 12.0 parts by weight per 100 parts by weight of the overall polymer in the resist composition. An excess of the PAG added may give rise to such problems as degraded resolution and foreign particles upon development and resist stripping. The PAGs may be used alone or in admixture of two or more.

The resist composition may be obtained by dissolving the foregoing components in a solvent to be described later and optionally adding other additives such as a basic compound having a molecular weight of up to 1,000, a surfactant, and a dissolution inhibitor.

In the resist composition of the invention, a basic compound need not be positively added because a basic component is contained in the polymer. Nevertheless, it is acceptable to add a basic compound having a molecular weight of up to 1,000 for fine adjustment of a pattern profile such as overhanging at the top or footing near the substrate and fine adjustment of sensitivity. When used, the basic compound is preferably added in an amount of up to ½₀ mole per mole of the acid generator. An excess of the basic compound may compromise the effect of the polymer as component (C).

With respect to the basic compound which can be used herein, a number of suitable compounds are known, for example, from Patent Documents 1 to 5. Examples include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, imide derivatives, carbamate derivatives, and ammonium salts. Numerous examples of these basic compounds are described in Patent Document 2. Generally any of these basic compounds may be used. Two or more may be selected from these basic compounds and used in admixture.

Examples of the basic compound which is preferably compounded herein include tris(2-(methoxymethoxy)ethyl) amine N-oxide, morpholine derivatives, and imidazole derivatives.

An amine is effective when a resist pattern is formed on a substrate, typically a substrate having a surface layer of chromium compound, which is susceptible to a phenomenon that the resist film becomes substantially insoluble at the substrate interface during pattern formation, known as a footing phenomenon. Specifically, an amine compound or amine oxide compound having a carboxyl group, but free of hydrogen in covalent bond with nitrogen serving as basic center (exclusive of those amine and amine oxide compounds whose nitrogen atom is contained in the cyclic structure of aromatic ring) is effectively used for improving the pattern profile.

Preferred examples of the amine or amine oxide compound having a carboxyl group, but free of hydrogen in covalent bond with nitrogen serving as basic center include compounds of the general formulae (10) to (12), but are not limited thereto.

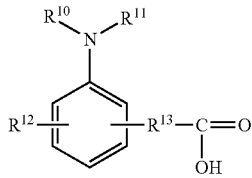  (10)

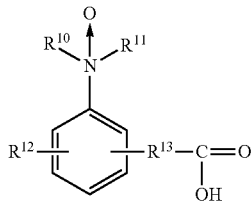  (11)

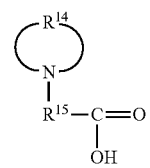  (12)

Herein $R^{10}$ and $R^{11}$ are each independently a straight, branched or cyclic $C_1$-$C_{20}$ alkyl group, $C_6$-$C_{20}$ aryl group, $C_7$-$C_{20}$ aralkyl group, $C_1$-$C_{10}$ hydroxyalkyl group, $C_2$-$C_{10}$ alkoxyalkyl group, $C_2$-$C_{10}$ acyloxyalkyl group, or $C_2$-$C_{10}$ alkylthioalkyl group. $R^{10}$ and $R^{11}$ may bond together to form a ring with the nitrogen atom to which they are attached. $R^{12}$ is hydrogen, a straight, branched or cyclic $C_1$-$C_{20}$ alkyl group, $C_6$-$C_{20}$ aryl group, $C_7$-$C_{20}$ aralkyl group, $C_1$-$C_{10}$ hydroxyalkyl group, $C_2$-$C_{10}$ alkoxyalkyl group, $C_2$-$C_{10}$ acyloxyalkyl group, $C_2$-$C_{10}$ alkylthioalkyl group, or halogen. $R^{13}$ is a single bond, a straight, branched or cyclic $C_1$-$C_{20}$ alkylene group, or $C_6$-$C_{20}$ arylene group. $R^{14}$ is an optionally substituted, straight or branched $C_2$-$C_{20}$ alkylene group whose carbon-carbon linkage may be separated by at least one carbonyl (—CO—), ether (—O—), ester (—COO—) or sulfide (—S—) group. $R^{15}$ is a straight, branched or cyclic $C_1$-$C_{20}$ alkylene group or $C_6$-$C_{20}$ arylene group.

Exemplary groups in these structural formulae are given below, but not limited thereto. Suitable $C_6$-$C_{20}$ aryl groups include phenyl, naphthyl, anthryl, phenanthryl, pyrenyl, naphthacenyl, and fluorenyl. Suitable straight, branched or cyclic $C_1$-$C_{20}$ alkyl groups include methyl, ethyl, propyl, isopropyl, butyl, isobutyl, t-butyl, pentyl, hexyl, decyl, cyclopentyl, cyclohexyl, and decahydronaphthalenyl. Suitable $C_7$-$C_{20}$ aralkyl groups include benzyl, phenethyl, phenylpropyl, naphthylmethyl, naphthylethyl, and anthracenylmethyl. Suitable $C_1$-$C_{10}$ hydroxyalkyl groups include hydroxymethyl, hydroxyethyl, and hydroxypropyl. Suitable $C_2$-$C_{10}$ alkoxyalkyl groups include methoxymethyl, 2-methoxyethyl, ethoxymethyl, 2-ethoxyethyl, propoxymethyl, 2-propoxyethyl, butoxymethyl, 2-butoxyethyl, amyloxymethyl, 2-amyloxyethyl, cyclohexyloxymethyl, 2-cyclohexyloxyethyl, cyclopentyloxymethyl, 2-cyclopentyloxyethyl, and isomers of their alkyl moiety. Suitable $C_2$-$C_{10}$ acyloxyalkyl groups include formyloxymethyl, acetoxymethyl, propionyloxymethyl, butyryloxymethyl, pivaloyloxymethyl, cyclohexanecarbonyloxymethyl, and decanoyloxymethyl. Suitable $C_2$-$C_{10}$ alkylthioalkyl groups include methylthiomethyl, ethylthiomethyl, propylthiomethyl, isopropylthiomethyl, butylthiomethyl, isobutylthiomethyl, t-butylthiomethyl, t-amylthiomethyl, decylthiomethyl, and cyclohexylthiomethyl.

Preferred examples of the amine compound of formula (10) include, but are not limited thereto, o-dimethylaminobenzoic acid, p-dimethylaminobenzoic acid, m-dimethylaminobenzoic acid, p-diethylaminobenzoic acid, p-dipropylaminobenzoic acid, p-dibutylaminobenzoic acid, p-dipentylaminobenzoic acid, p-dihexylaminobenzoic acid, p-diethanolaminobenzoic acid, p-diisopropanolaminobenzoic acid, p-dimethanolaminobenzoic acid, 2-methyl-4-diethylaminobenzoic acid, 2-methoxy-4-diethylaminobenzoic acid, 3-dimethylamino-2-naphthalenic acid, 3-diethylamino-2-naphthalenic acid, 2-dimethylamino-5-bromobenzoic acid, 2-dimethylamino-5-chlorobenzoic acid, 2-dimethylamino-5-iodobenzoic acid, 2-dimethylamino-5-hydroxybenzoic acid, 4-dimethylaminophenylacetic acid, 4-dimethylaminophenylpropionic acid, 4-dimethylaminophenylbutyric acid, 4-dimethylaminophenylmalic acid, 4-dimethylaminophenylpyruvic acid, 4-dimethylaminophenyllactic acid, 2-(4-dimethylaminophenyl)benzoic acid, and 2-(4-(dibutylamino)-2-hydroxybenzoyl)benzoic acid.

Preferred examples of the amine oxide compound of formula (11) include oxidized forms of exemplary amine compounds of formula (10), but are not limited thereto.

Preferred examples of the amine compound of formula (12) include, but are not limited thereto, 1-piperidinepropionic acid, 1-piperidinebutyric acid, 1-piperidinemalic acid, 1-piperidinepyruvic acid, and 1-piperidinelactic acid.

Some of the compounds having an amine oxide structure represented by formula (11) are existing and some are novel compounds. They may be prepared by selecting an optimum method in accordance with a particular structure. Exemplary non-limiting methods include oxidizing reaction of a nitrogen-containing compound using an oxidizing agent and oxidizing reaction of a nitrogen-containing compound in a hydrogen peroxide water diluted solution. These methods are described below in detail.

One exemplary method for preparing a nitrogen-containing alcohol compound through esterifying reaction is shown below. This method is applicable to the synthesis of a compound of formula (11).

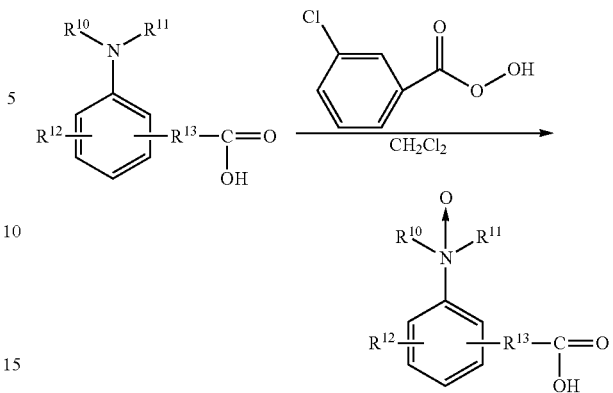

Herein $R^{10}$ to $R^{13}$ are as defined above.

This reaction is an oxidizing reaction of an amine using an oxidizing agent, m-chloroperbenzoic acid. The reaction may be performed using other oxidizing agents commonly employed in standard oxidizing reaction. Following the reaction, the reaction mixture may be purified by standard techniques such as distillation, chromatography and recrystallization. Reference is made to Patent Document 7.

To the resist composition, any of surfactants commonly used for improving coating characteristics may be added. While a number of surfactants are well known and described in Patent Documents 1 to 7, any suitable one may be selected therefrom.

In the resist composition, the surfactant is preferably formulated in an amount of up to 2 parts, and more preferably up to 1 part by weight, per 100 parts by weight of the overall polymer. When used, the surfactant is preferably added in an amount of at least 0.01 part by weight.

An organic solvent may be used in the preparation of the resist composition. It may be any of organic solvents in which the polymer(s), acid generator and other additives are dissolvable. Suitable organic solvents include, but are not limited to, ketones such as cyclohexanone and methyl n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in admixture. Of these solvents, ethyl lactate, propylene glycol monomethyl ether, PGMEA, and mixtures thereof are preferred because the acid generator is most soluble therein.

In the resist composition, the organic solvent is preferably used in an amount of 1,000 to 10,000 parts by weight, more preferably 2,000 to 9,700 parts by weight per 100 parts by weight of the overall polymer(s). When adjusted to such a concentration, the resist composition is applicable by a spin coating technique to form a resist film having a thickness of 10 to 200 nm and an improved flatness in a consistent manner.

Process

Pattern formation using the resist composition of the invention may be performed by well-known lithography processes.

The process generally involves coating, prebaking, exposure to EB or EUV, PEB, and development with alkaline developer. The resist composition is first applied onto a substrate for IC fabrication (silicon wafer having a surface layer of Si, $SiO_2$, SiN, SiON, TiN, WSi, BPSG, SOG, organic antireflective coating or the like) or a substrate for mask circuit fabrication (quartz substrate having a surface layer of Cr, CrO, CrON, MoSi or the like) by a suitable coating technique such as spin coating. The coating is prebaked on a hot plate at a temperature of 60 to 150° C. for 1 to 10 minutes, preferably 80 to 140° C. for 1 to 5 minutes to form a resist film of 0.05 to 2.0 μm thick.

Then the resist film is exposed to EUV through a mask having a desired pattern. Alternatively, a pattern is written on the resist film directly with EB. The exposure dose is preferably 1 to 200 mJ/cm², more preferably 10 to 100 mJ/cm². The exposure may be performed by conventional lithography whereas the immersion lithography of holding a liquid between the mask and the resist film may be employed if desired. In this case, a protective film which is insoluble in water may be applied on the resist film. The resist film is then baked (PEB) on a hot plate at 60 to 150° C. for 1 to 5 minutes, preferably 80 to 140° C. for 1 to 3 minutes. Thereafter the resist film is developed with a developer in the form of an aqueous base solution, for example, 0.1 to 5 wt %, preferably 2 to 3 wt % aqueous solution of tetramethylammonium hydroxide (TMAH) for 0.1 to 3 minutes, preferably 0.5 to 2 minutes by conventional techniques such as dip, puddle and spray techniques. In this way, a desired resist pattern is formed on the substrate.

One advantage is that the resist film has high etch resistance. Also the resist composition is effective when it is required that the pattern experience a minimal change of line width even when the duration between exposure and PEB is prolonged. Because of these advantages, the resist composition is effective in processing a photomask blank by EB lithography process which requires a long time for patternwise exposure.

EXAMPLE

Synthesis Examples, Examples, and Comparative Examples are given below by way of illustration and not by way of limitation. The average molecular weights including weight average molecular weight (Mw) and number average molecular weight (Mn) are determined by gel permeation chromatography (GPC) versus polystyrene standards, from which a dispersity (Mw/Mn) is computed. Me stands for methyl. The compositional ratio of a copolymer is on a molar basis.

Polymer Synthesis Example 1

In a 200-mL dropping funnel under nitrogen blanket, a solution was prepared by dissolving 22.3 g of 4-hydroquinone monomethacrylate, 5.7 g of acenaphthylene, 21.4 g of 4-amyloxystyrene, 0.55 g of a monomer Z-1 of the structure shown below, and 5.1 g of dimethyl 2,2'-azobis(2-methyl-propionate) (V601, Wako Pure Chemical Industries, Ltd.) in 64 g of methyl ethyl ketone (MEK) as a solvent. A 300-mL polymerization flask was purged with nitrogen, charged with 53 g of MEK, and heated at 80° C., after which the solution was added dropwise to the flask over 4 hours. After the completion of dropwise addition, stirring was continued for 16 hours while maintaining the polymerization temperature of 80° C. The polymerization solution was then cooled down to room temperature and added dropwise to 1,000 g of hexane for precipitation. The copolymer precipitate was collected by filtration and washed twice with 200 g of hexane. The mass collected by filtration was dissolved in 120 g of MEK. The MEK solution was passed through a nylon filter with a pore size of 0.02 μm and added dropwise to 1,000 g of hexane for precipitation. The copolymer precipitate was collected by filtration, washed twice with 200 g of hexane, and dried, yielding 48 g of a white copolymer, designated Polymer 1, having Mw=3,730 and Mw/Mn=1.62.

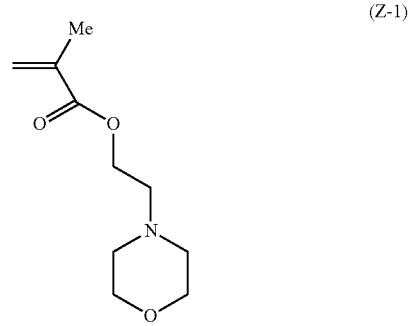

Polymer Synthesis Example 2

In a 200-mL dropping funnel under nitrogen blanket, a solution was prepared by dissolving 25.6 g of 4-(1-ethoxyethoxy)styrene, 4.1 g of acenaphthylene, 19.8 g of 4-amyloxystyrene, 0.53 g of monomer Z-1 of the above structure, and 4.9 g of dimethyl 2,2'-azobis(2-methyl-propionate) (V601, Wako Pure Chemical Industries, Ltd.) in 64 g of propylene glycol monomethyl ether (PGME) as a solvent. A 300-mL polymerization flask was purged with nitrogen, charged with 53 g of PGME, and heated at 80° C., after which the solution was added dropwise to the flask over 4 hours. After the completion of dropwise addition, stirring was continued for 20 hours while maintaining the polymerization temperature of 80° C. Thereafter, the polymerization solution was cooled down to room temperature, combined with 18 g of methanol and 0.85 g of oxalic acid dihydrate, and stirred at 50° C. for 3 hours. The reaction solution was added dropwise to a mixture of 1,620 g of water and 30 g of methanol for precipitation. The copolymer precipitate was collected by filtration, washed twice with a mixture of 490 g of water and 10 g of methanol, and dried, yielding 36.0 g of a white hydroxystyrene copolymer, designated Polymer 2, having Mw=5,470 and Mw/Mn=1.64.

Polymer Synthesis Example 3

A polymer was obtained by introducing hydroxystyrene units according to the same procedure as Polymer Synthesis Example 2 except that the type and amount of monomers were changed. The polymer was further reacted with 1-chloro-1-methoxy-2-methylpropane under basic conditions to produce an acetal-modified polymer, designated Polymer 3, having Mw=5,860 and Mw/Mn=1.65.

With respect to the deprotection and protection of polyhydroxystyrene derivative, reference may be made to Patent Documents 8 and 9.

Polymer Synthesis Examples 4 to 30

Resins (Polymers 4 to 30) shown in Table 1 were synthesized by the same procedure as Polymer Synthesis Example 1, 2 or 3 except that the type and amount of monomers were changed. The units 1 to 4 in Table 1 have the structure shown in Table 2. In Table 1, a ratio of each unit incorporated is on a molar basis.

TABLE 1

| Resin | Unit 1 (ratio) | Unit 2 (ratio) | Unit 3 (ratio) | Unit 4 (ratio) |
|---|---|---|---|---|
| Polymer 1 | A-1(0.45) | B-1(0.41) | D-2(0.13) | Z-1(0.01) |
| Polymer 2 | A-2(0.50) | B-1(0.39) | D-2(0.10) | Z-1(0.01) |
| Polymer 3 | A-3(0.60) | B-1(0.29) | D-2(0.10) | Z-1(0.01) |
| Polymer 4 | A-2(0.51) | C-1(0.38) | D-1(0.10) | Z-1(0.01) |
| Polymer 5 | A-1(0.45) | B-1(0.41) | D-1(0.13) | Z-1(0.01) |
| Polymer 6 | A-1(0.45) | B-2(0.41) | D-2(0.13) | Z-1(0.01) |
| Polymer 7 | A-1(0.45) | C-2(0.40) | D-2(0.13) | Z-1(0.01) |
| Polymer 8 | A-1(0.45) | C-4(0.40) | D-2(0.13) | Z-1(0.01) |
| Polymer 9 | A-1(0.46) | C-5(0.40) | D-2(0.13) | Z-1(0.01) |
| Polymer 10 | A-2(0.50) | B-2(0.39) | D-2(0.10) | Z-1(0.01) |
| Polymer 11 | A-2(0.50) | C-2(0.39) | D-2(0.10) | Z-1(0.01) |
| Polymer 12 | A-2(0.50) | C-3(0.39) | D-2(0.10) | Z-1(0.01) |
| Polymer 13 | A-1(0.45) | B-1(0.35) | D-2(0.15) | Z-1(0.05) |
| Polymer 14 | A-2(0.45) | B-1(0.35) | D-2(0.15) | Z-1(0.05) |
| Polymer 15 | A-1(0.45) | B-1(0.32) | D-2(0.13) | Z-1(0.10) |
| Polymer 16 | A-2(0.50) | B-1(0.30) | D-2(0.10) | Z-1(0.10) |
| Polymer 17 | A-3(0.60) | B-1(0.20) | D-2(0.10) | Z-1(0.10) |
| Polymer 18 | A-2(0.51) | C-1(0.29) | D-1(0.10) | Z-1(0.10) |
| Polymer 19 | A-1(0.45) | B-1(0.32) | D-1(0.13) | Z-1(0.10) |
| Polymer 20 | A-1(0.45) | B-2(0.32) | D-2(0.13) | Z-1(0.10) |
| Polymer 21 | A-1(0.45) | C-2(0.31) | D-2(0.13) | Z-1(0.10) |
| Polymer 22 | A-1(0.45) | C-4(0.31) | D-2(0.13) | Z-1(0.10) |
| Polymer 23 | A-1(0.46) | C-5(0.31) | D-2(0.13) | Z-1(0.10) |
| Polymer 24 | A-2(0.50) | B-2(0.30) | D-2(0.10) | Z-1(0.10) |
| Polymer 25 | A-2(0.50) | C-2(0.30) | D-2(0.10) | Z-1(0.10) |
| Polymer 26 | A-2(0.50) | C-3(0.30) | D-2(0.10) | Z-1(0.10) |
| Polymer 27 | A-1(0.80) | Z-1(0.20) | — | — |
| Polymer 28 | A-2(0.80) | Z-1(0.20) | — | — |
| Polymer 29 | A-1(0.60) | Z-1(0.40) | — | — |
| Polymer 30 | A-2(0.60) | Z-1(0.40) | — | — |

TABLE 2

A-1

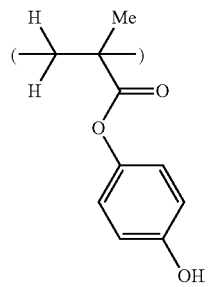

A-2

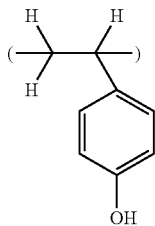

A-3

TABLE 2-continued

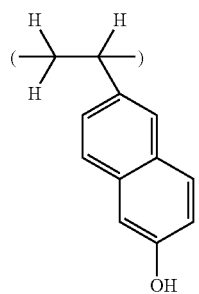

B-1

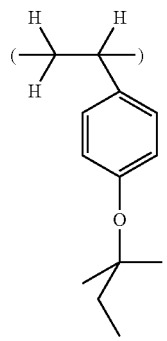

B-2

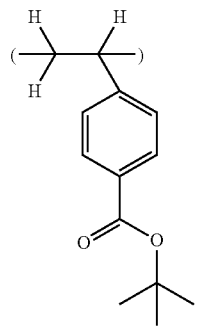

C-1

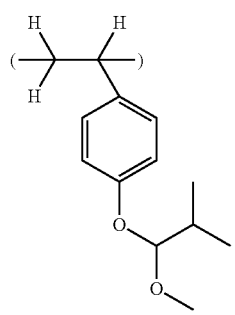

C-2

TABLE 2-continued

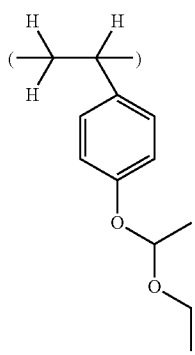

C-3

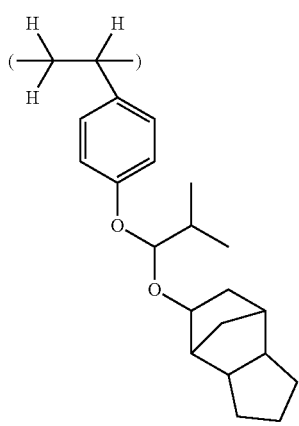

C-4

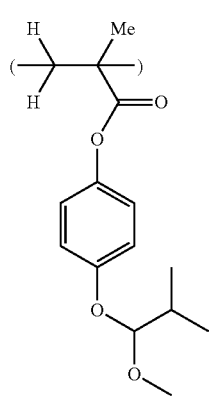

C-5

TABLE 2-continued

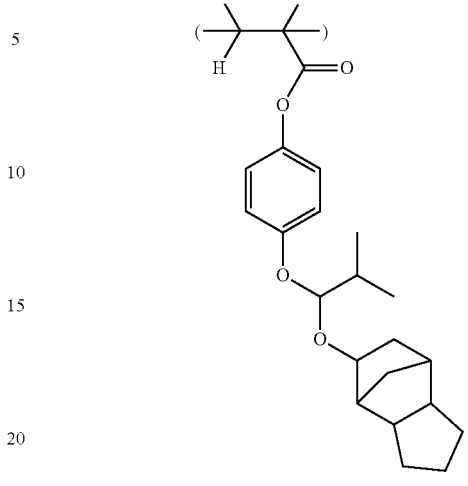

D-1

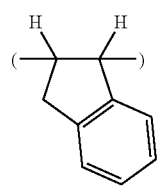

D-2

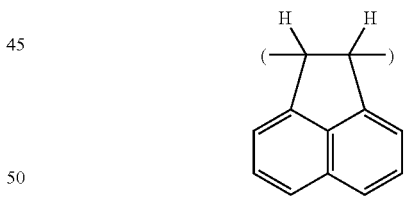

EXAMPLES AND COMPARATIVE EXAMPLES

Preparation of Positive Resist Compositions

Resist compositions were prepared by using inventive resins (Polymer 1 to 30) and other resins (Polymers K and M), and dissolving the polymers, an acid generator (PAG-A), and a basic compound (Base-1) in an organic solvent mixture in accordance with the recipe shown in Table 3. These compositions were each filtered through a nylon or UPE filter having a pore size of 0.02 μm, thereby giving positive resist composition solutions.

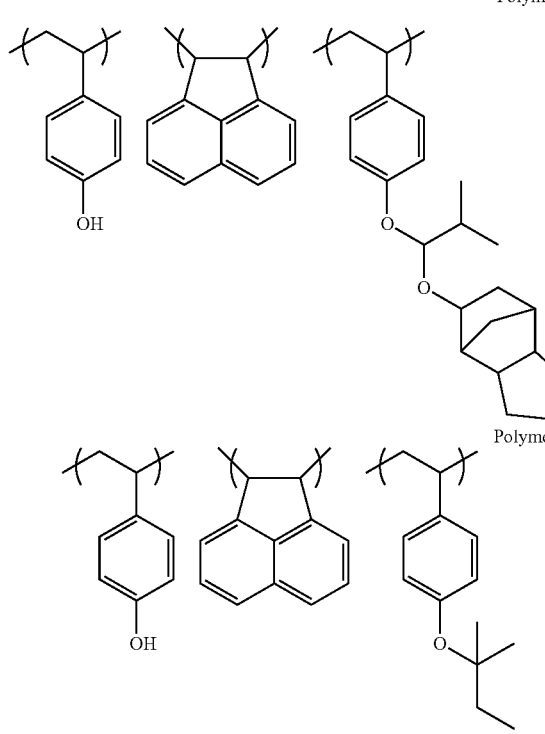

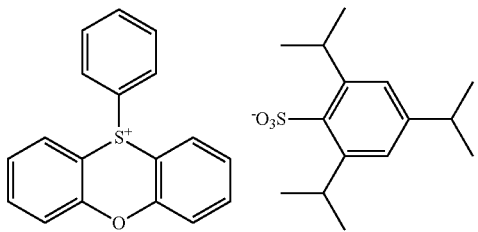

The organic solvents used were propylene glycol monomethyl ether acetate (PGMEA), ethyl lactate (EL), and propylene glycol monomethyl ether (PGME). Each composition further contained 0.075 pbw of a surfactant PF-636 (Omnova Solutions, Inc.).

TABLE 3

|  | Resin (pbw) | PAG (pbw) | Base (pbw) | Additive (pbw) | Solvent 1 (pbw) | Solvent 2 (pbw) | Solvent 3 (pbw) |
| --- | --- | --- | --- | --- | --- | --- | --- |
| Example 1 | Polymer 1 (80) | PAG-A (8) | — | — | PGMEA (1,584) | EL (1,584) | PGME (2,112) |
| Example 2 | Polymer 1 (80) | PAG-A (8) | — | Base-1 (0.2) | PGMEA (1,584) | EL (1,584) | PGME (2,112) |
| Example 3 | Polymer 2 (80) | PAG-A (8) | — | — | PGMEA (1,584) | EL (1,584) | PGME (2,112) |
| Example 4 | Polymer 3 (80) | PAG-A (8) | — | — | PGMEA (1,584) | EL (1,584) | PGME (2,112) |
| Example 5 | Polymer 4 (80) | PAG-A (8) | — | — | PGMEA (1,584) | EL (1,584) | PGME (2,112) |
| Example 6 | Polymer 5 (80) | PAG-A (8) | — | — | PGMEA (1,584) | EL (1,584) | PGME (2,112) |
| Example 7 | Polymer 6 (80) | PAG-A (8) | — | — | PGMEA (1,584) | EL (1,584) | PGME (2,112) |
| Example 8 | Polymer 7 (80) | PAG-A (8) | — | — | PGMEA (1,584) | EL (1,584) | PGME (2,112) |
| Example 9 | Polymer 8 (80) | PAG-A (8) | — | — | PGMEA (1,584) | EL (1,584) | PGME (2,112) |
| Example 10 | Polymer 9 (80) | PAG-A (8) | — | — | PGMEA (1,584) | EL (1,584) | PGME (2,112) |
| Example 11 | Polymer 10 (80) | PAG-A (8) | — | — | PGMEA (1,584) | EL (1,584) | PGME (2,112) |
| Example 12 | Polymer 11 (80) | PAG-A (8) | — | — | PGMEA (1,584) | EL (1,584) | PGME (2,112) |
| Example 13 | Polymer 12 (80) | PAG-A (8) | — | — | PGMEA (1,584) | EL (1,584) | PGME (2,112) |
| Example 14 | Polymer K (80) | PAG-A (8) | Polymer 13 (15) | — | PGMEA (1,584) | EL (1,584) | PGME (2,112) |
| Example 15 | Polymer M (80) | PAG-A (B) | Polymer 13 (15) | — | PGMEA (1,584) | EL (1,584) | PGME (2,112) |
| Example 16 | Polymer K (80) | PAG-A (8) | Polymer 14 (15) | — | PGMEA (1,584) | EL (1,584) | PGME (2,112) |
| Example 17 | Polymer K (80) | PAG-A (B) | Polymer 15 (7) | — | PGMEA (1,584) | EL (1,584) | PGME (2,112) |
| Example 18 | Polymer K (80) | PAG-A (B) | Polymer 16 (7) | — | PGMEA (1,584) | EL (1,584) | PGME (2,112) |
| Example 19 | Polymer K (80) | PAG-A (B) | Polymer 17 (7) | — | PGMEA (1,584) | EL (1,584) | PGME (2,112) |

TABLE 3-continued

| | Resin (pbw) | PAG (pbw) | Base (pbw) | Additive (pbw) | Solvent 1 (pbw) | Solvent 2 (pbw) | Solvent 3 (pbw) |
|---|---|---|---|---|---|---|---|
| Example 20 | Polymer K (80) | PAG-A (8) | Polymer 18 (7) | — | PGMEA (1,584) | EL (1,584) | PGME (2,112) |
| Example 21 | Polymer K (80) | PAG-A (8) | Polymer 19 (7) | — | PGMEA (1,584) | EL (1,584) | PGME (2,112) |
| Example 22 | Polymer K (80) | PAG-A (B) | Polymer 20 (7) | — | PGMEA (1,584) | EL (1,584) | PGME (2,112) |
| Example 23 | Polymer K (80) | PAG-A (8) | Polymer 21 (7) | — | PGMEA (1,584) | EL (1,584) | PGME (2,112) |
| Example 24 | Polymer K (80) | PAG-A (8) | Polymer 22 (7) | — | PGMEA (1,584) | EL (1,584) | PGME (2,112) |
| Example 25 | Polymer K (80) | PAG-A (8) | Polymer 23 (7) | — | PGMEA (1,584) | EL (1,584) | PGME (2,112) |
| Example 26 | Polymer K (80) | PAG-A (8) | Polymer 24 (7) | — | PGMEA (1,584) | EL (1,584) | PGME (2,112) |
| Example 27 | Polymer K (80) | PAG-A (8) | Polymer 25 (7) | — | PGMEA (1,584) | EL (1,584) | PGME (2,112) |
| Example 28 | Polymer K (80) | PAG-A (8) | Polymer 26 (7) | — | PGMEA (1,584) | EL (1,584) | PGME (2,112) |
| Example 29 | Polymer K (80) | PAG-A (8) | Polymer 27 (3) | — | PGMEA (1,584) | EL (1,584) | PGME (2,112) |
| Example 30 | Polymer K (80) | PAG-A (8) | Polymer 28 (3) | — | PGMEA (1,584) | EL (1,584) | PGME (2,112) |
| Example 31 | Polymer K (80) | PAG-A (8) | Polymer 29 (1.1) | — | PGMEA (1,584) | EL (1,584) | PGME (2,112) |
| Example 32 | Polymer K (80) | PAG-A (8) | Polymer 30 (1.1) | — | PGMEA (1,584) | EL (1,584) | PGME (2,112) |
| Comparative Example 1 | Polymer K (80) | PAG-A (8) | Base-1 (0.7) | — | PGMEA (1,584) | EL (1,584) | PGME (2,112) |
| Comparative Example 2 | Polymer M (80) | PAG-A (8) | Base-1 (0.7) | — | PGMEA (1,584) | EL (1,584) | PGME (2,112) |

*pbw: parts by weight

Evaluation of EB Image Writing

Using a coater/developer system Clean Track ACT-M (Tokyo Electron Ltd.), each of the positive resist compositions was spin-coated onto a 152-mm square mask blank having a chromium oxynitride film at the outermost surface and pre-baked on a hot plate at 110° C. for 600 seconds to form a resist film of 60 nm thick. The thickness of the resist film was measured by an optical film thickness measurement system Nanospec (Nanometrics Inc.). Measurement was made at 81 points in the plane of the blank substrate excluding a peripheral band extending 10 mm inward from the blank periphery, and an average film thickness and a film thickness range were computed therefrom.

The coated mask blanks were exposed to electron beam using an EB writer system EBM-5000Plus (NuFlare Technology Inc., accelerating voltage 50 keV), then baked (PEB) at 110° C. for 600 seconds, and developed with a 2.38 wt % tetramethylammonium hydroxide aqueous solution, thereby yielding positive patterns.

The patterned wafer was observed under a top-down scanning electron microscope (TDSEM). The optimum exposure (Eop) was defined as the exposure dose ($\mu C/cm^2$) which provided a 1:1 resolution at the top and bottom of a 200-nm 1:1 line-and-space pattern. The maximum resolution of the resist was defined as the minimum line width of a line-and-space pattern that could be resolved and separated at the optimum exposure. The LER of a 100-nm line-and-space pattern was measured under SEM. On observation in cross section of the resist pattern under SEM, it was visually judged whether or not the pattern profile was rectangular. Table 4 tabulates the test results of the inventive and comparative resist compositions on EB image writing.

TABLE 4

| | Eop ($\mu C/cm^2$) | Maximum resolution (nm) | LER (nm) | Pattern profile |
|---|---|---|---|---|
| Example 1 | 25 | 40 | 3.4 | rectangular |
| Example 2 | 28 | 40 | 3.5 | rectangular |
| Example 3 | 24 | 35 | 3.7 | rectangular |
| Example 4 | 22 | 40 | 3.2 | rectangular |
| Example 5 | 25 | 35 | 3.5 | rectangular |
| Example 6 | 26 | 40 | 3.7 | rectangular |
| Example 7 | 23 | 35 | 3.9 | rectangular |
| Example 8 | 23 | 40 | 3.2 | rectangular |
| Example 9 | 23 | 40 | 3.2 | rectangular |
| Example 10 | 23 | 40 | 3.2 | rectangular |
| Example 11 | 23 | 35 | 3.8 | rectangular |
| Example 12 | 22 | 40 | 3.6 | rectangular |
| Example 13 | 25 | 35 | 3.4 | rectangular |
| Example 14 | 24 | 40 | 3.7 | rectangular |
| Example 15 | 26 | 40 | 3.9 | rectangular |
| Example 16 | 26 | 35 | 3.7 | rectangular |
| Example 17 | 25 | 40 | 3.6 | rectangular |
| Example 18 | 22 | 40 | 3.4 | rectangular |
| Example 19 | 25 | 40 | 3.6 | rectangular |
| Example 20 | 25 | 35 | 3.7 | rectangular |
| Example 21 | 23 | 40 | 3.5 | rectangular |
| Example 22 | 23 | 40 | 3.7 | rectangular |
| Example 23 | 23 | 40 | 3.8 | rectangular |
| Example 24 | 24 | 35 | 3.6 | rectangular |
| Example 25 | 24 | 35 | 3.5 | rectangular |
| Example 26 | 23 | 40 | 3.6 | rectangular |
| Example 27 | 26 | 35 | 3.4 | rectangular |
| Example 28 | 24 | 40 | 3.6 | rectangular |
| Example 29 | 25 | 35 | 3.8 | rectangular |
| Example 30 | 26 | 40 | 3.6 | rectangular |
| Example 31 | 25 | 40 | 3.5 | rectangular |
| Example 32 | 26 | 40 | 3.4 | rectangular |
| Comparative Example 1 | 25 | 60 | 5.7 | rounded top |
| Comparative Example 2 | 27 | 55 | 5.6 | rounded top |

It is evident from Table 4 that the resist compositions of Examples are improved in resolution and LER over those of Comparative Examples 1 and 2 when processed by EB lithography. The chemically amplified positive resist composition of the invention is suited as ultrafine pattern-forming material for VLSI fabrication and mask pattern-forming material by EB lithography.

Japanese Patent Application No. 2010-031030 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified positive resist composition for EB or EUV lithography, comprising
   (A) a polymer or a blend of polymers, at least one polymer having a protective group which is deprotected with an acid so that a film of the polymer or polymer blend is insoluble in alkaline developer, but turns soluble therein under the action of acid,
   (B) an acid generator capable of generating an acid,
   (C) a basic compound for inhibiting the action of acid, and
   (D) a solvent, wherein
   the basic compound as component (C) is a polymer comprising recurring units of the general formulae (1) and (2) and recurring units of formula (5) and (6) and constitutes at least one polymer as component (A), and
   the composition may optionally further comprise a compound having a molecular weight of up to 1,000 as component (C) other than the basic compound in polymer form, in an amount of up to $1/20$ mole per mole of the acid generator as component (B),

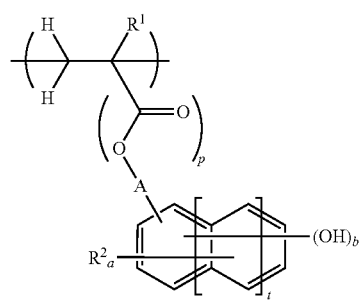

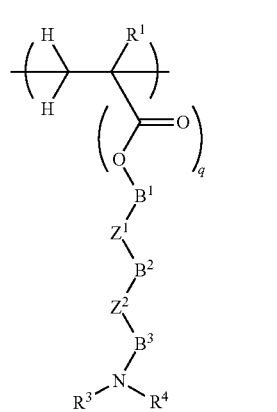

wherein A is a single bond or a $C_1$-$C_{10}$ alkylene group which may be separated by an ethereal oxygen atom, $R^1$ is each independently hydrogen or methyl,
$R^2$ is each independently a $C_1$-$C_6$ alkyl group,
$B^1$, $B^2$, and $B^3$ are each independently a single bond, or a linkage selected from the group consisting of a straight or branched $C_1$-$C_{10}$ alkylene group which may contain an ethereal oxygen atom, a divalent $C_5$-$C_{10}$ alicyclic group which may be separated by an ethereal oxygen atom, a divalent $C_6$-$C_{14}$ aromatic group which may be separated by an ethereal oxygen atom, and combinations comprising at least one of the foregoing,
$Z^1$ and $Z^2$ are each independently a single bond, —CO—O— or —O—CO—, with the proviso that $Z^1$ and $Z^2$ do not form a —O—O— structure when $B^1$, $B^2$, and $B^3$ contain an ethereal oxygen atom, and $B^3$ is not a single bond when $Z^2$ is —CO—O— or —O—CO—,
$R^3$ and $R^4$ are each independently hydrogen or a monovalent $C_1$-$C_{10}$ hydrocarbon group which may contain a heteroatom, with the proviso that $R^3$ and $R^4$ are not hydrogen at the same time, $R^3$ and $R^4$ may bond together to form a ring with the nitrogen atom to which they are attached, and $R^3$ and $R^4$ are a divalent $C_2$-$C_{12}$ hydrocarbon group which may contain a heteroatom when they form a ring,
$B^3$ may bond with $R^3$ or $R^4$ to form a ring with the nitrogen atom to which they are attached, and in this case, the nitrogen-containing ring is a 5 to 7-membered ring which excludes a ring of the structure that a lone pair of the nitrogen atom renders the nitrogen-containing ring aromatic, and the nitrogen-containing ring is not an aromatic ring,
a is an integer of 0 to 4, b is a positive integer of 1 to 5, p and q are each independently 0 or 1, t is an integer of 0 to 2, with the proviso that when q=0, the atom in $B^1$ that bonds with a main chain carbon is an ethereal oxygen atom or a carbon atom forming an aromatic ring, and when q=0 and $Z^1$ and $Z^2$ are single bonds, one or more of $B^1$, $B^2$, and $B^3$ should contain at least two consecutive carbon atoms originating from an alkylene group, or an aromatic group,

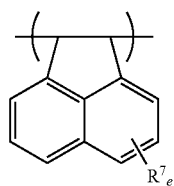

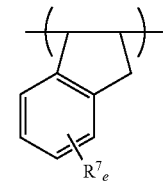

wherein e is an integer of 0 to 4, and $R^7$ is each independently a halogen atom, a hydroxyl group, a hydroxyl group protected with an acid labile group, optionally halo-substituted $C_2$-$C_7$ acyloxy group, optionally halo-substituted $C_1$-$C_6$ alkyl group, optionally halo-substituted $C_1$-$C_6$ alkoxy group, or optionally halo-substituted $C_2$-$C_7$ alkoxycarbonyl group,
said recurring units (1) being contained in a content of at least 45 mol% and said recurring units (5) or (6) being contained in a content of at least 10 mol% in the polymer.

2. The resist composition of claim 1 wherein the basic compound as component (C) is a polymer comprising recurring units of the general formula (3) in addition to the recurring units of formulae (1) and (2),

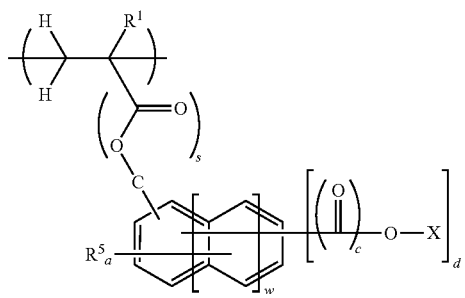

(3)

wherein C is a single bond or a $C_1$-$C_{10}$ alkylene group which may contain an ethereal oxygen atom, $R^1$ is hydrogen or methyl, $R^5$ is each independently a $C_1$-$C_6$ alkyl group, X is an acid labile group when d is 1, and X is hydrogen or an acid labile group when d is 2 or 3, with at least one X being an acid labile group, a is an integer of 0 to 4, c is 0 or 1, d is an integer of 1 to 3, s is 0 or 1, and w is an integer of 0 to 2.

3. A pattern forming process comprising the steps of:
applying the positive resist composition of claim 1 onto a processable substrate to form a resist film,
exposing the film patternwise to EB or EUV radiation, and
developing the exposed film with an alkaline developer to form a resist pattern.

4. The process of claim 3 wherein the processable substrate is a photomask blank.

5. The process of claim 4 wherein the photomask blank comprises a chromium compound at the outermost surface.

* * * * *